(12) United States Patent  
Sasaki

(10) Patent No.: US 7,796,327 B2  
(45) Date of Patent: Sep. 14, 2010

(54) LIGHT TRANSMITTING ELECTROMAGNETIC WAVE SHIELDING FILM, OPTICAL FILTER AND PLASMA DISPLAY PANEL

(75) Inventor: Hirotomo Sasaki, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 249 days.

(21) Appl. No.: 11/908,685

(22) PCT Filed: Mar. 14, 2006

(86) PCT No.: PCT/JP2006/305005

§ 371 (c)(1), (2), (4) Date: Sep. 14, 2007

(87) PCT Pub. No.: WO2006/098334

PCT Pub. Date: Sep. 21, 2006

(65) Prior Publication Data

US 2009/0052017 A1    Feb. 26, 2009

(30) Foreign Application Priority Data

Mar. 15, 2005  (JP)  ............................. 2005-073584

(51) Int. Cl.  
G02B 5/08  (2006.01)  
G02B 5/20  (2006.01)

(52) U.S. Cl. .................... 359/360; 359/350

(58) Field of Classification Search ............ 359/350, 359/359, 360  
See application file for complete search history.

(56) References Cited

U.S. PATENT DOCUMENTS

2004/0033384 A1    2/2004   Funkenbusch et al.

2004/0229028 A1 *  11/2004  Sasaki et al. ............... 428/220

FOREIGN PATENT DOCUMENTS

| EP | 1 434 248 A2 | 6/2004 |
|---|---|---|
| JP | 63-206500 A | 8/1988 |
| JP | 5-16281 A | 1/1993 |
| JP | 5-283889 A | 10/1993 |
| JP | 5-327274 A | 12/1993 |
| JP | 9-247581 A | 9/1997 |
| JP | 10-75087 A | 3/1998 |
| JP | 10-338848 A | 12/1998 |
| JP | 11-170420 A | 6/1999 |
| JP | 11-170421 A | 6/1999 |
| JP | 11-330774 A | 11/1999 |
| JP | 2000-59084 A | 2/2000 |

(Continued)

OTHER PUBLICATIONS

International Search Report, May 16, 2006.

(Continued)

*Primary Examiner*—Joshua L Pritchett  
(74) *Attorney, Agent, or Firm*—Sughrue Mion, PLLC

(57) ABSTRACT

To provide a light transmitting electromagnetic wave shielding film which achieves both of excellent electromagnetic wave shielding properties and an excellent near infrared ray cutting function.

A light transmitting electromagnetic wave shielding film has a metallic silver part and a light transmitting part, which are formed by exposing an emulsion layer containing a silver salt emulsion formed on a support and then developing, wherein the light transmitting electromagnetic wave shielding film has infrared ray shielding properties.

17 Claims, 1 Drawing Sheet

FOREIGN PATENT DOCUMENTS

| | | |
|---|---|---|
| JP | 2001-319602 A | 11/2001 |
| JP | 2003-15533 A | 1/2003 |
| JP | 2003-23290 A | 1/2003 |
| JP | 2003-46293 A | 2/2003 |
| JP | 2004-207001 A | 7/2004 |
| JP | 2004-221564 A | 8/2004 |
| WO | 2004/016060 A1 | 2/2004 |

OTHER PUBLICATIONS

Extended European Search Report issued in European Patent Application No. 06729089.0 dated Dec. 16, 2009.

* cited by examiner

LIGHT TRANSMITTING ELECTROMAGNETIC WAVE SHIELDING FILM, OPTICAL FILTER AND PLASMA DISPLAY PANEL

TECHNICAL FIELD

This invention relates to a light transmitting electromagnetic wave shielding film, which is capable of shielding electromagnetic wave generated from the front face of a display such as a cathodic ray tube (CRT), a plasma display panel (PDP), a liquid crystal display, an electroluminescence (EL) display or a field emission display (EFD), a microwave oven, an electronic device, a printed line board and so on and has a light transmittance, and an optical filter and a plasma display panel having this light transmitting electromagnetic wave shielding film.

BACKGROUND ART

With the recent increasing use of various electrical facilities and electronic devices, there arises a rapid increase in electromagnetic interference (EMI). It is pointed out that EMI not only causes mechanical errors and disturbances in electrical and electronic devices but also exerts adverse effects on the health of workers operating these devices. Thus, it has been required to control the intensity of electromagnetic wave generated from electrical/electronic devices not to exceed a standard or regulation level.

As a countermeasure against the above-described EMI, it is needed to shield electromagnetic wave, which can be self-evidently established by using the characteristics of a metal of not allowing electromagnetic transmission. Thus, there have been adopted, for example, a method of using a housing made of a metal or a highly conductive material, a method of inserting a metal plate between circuit baseboards and a method of coating a cable with a metal foil. However, a display of a CRT, a PDP or the like should be transparent, since an operator should recognize characters and so on indicated on the screen. However, the front face of a display frequently becomes opaque in each of the methods as cited above, which makes these methods unsuitable as an electromagnetic wave shielding method.

Compared with a CRT, etc., a PDP generates a particularly large amount of electromagnetic wave. Therefore, it is required that a PDP has stronger electromagnetic wave shielding properties. Electromagnetic wave shielding properties can be briefly expressed in surface resistivity. A light transmitting electromagnetic wave shielding material for CRT should have a surface resistivity of about 300 Ω/sq or less, while a light transmitting electromagnetic wave shielding material for PDP should have a surface resistivity of about 2.5 Ω/sq or less. Furthermore, a light transmitting electromagnetic wave shielding material for plasma TV for consumer use should have an extremely high conductivity, i.e., a surface resistivity of about 1.5 Ω/sq or less, preferably 0.1 Ω/sq or less.

Concerning transparency, a light transmitting electromagnetic wave shielding material for CRT should have a transparency of about 70% or more, while a light transmitting electromagnetic wave shielding material for PDP should have a still higher transparency of 80% or more.

To overcome the problems as discussed above, there have been proposed various materials and methods for achieving both of favorable electromagnetic wave shielding properties and high transparency with the use of a metal mesh having apertures, as will be described herein below.

(1) Conductive Fiber

For example, Patent Document 1 discloses an electromagnetic wave shielding material made of conductive fibers. However, this shielding material suffers from a problem that it has a broad mesh line width and, therefore, makes the screen dark when employed in shielding a display screen. As a result, characters indicated on the display become hardly visible.

(2) Mesh Obtained by Electroless Plating Process

There has been proposed a method which comprises printing a lattice pattern by using an electroless plating catalyst and then conducting electroless plating (see, for example, Patent Document 2, Patent Document 3 and so on). In this case, however, the printed catalyst has a broad line width of about 60 µm, which makes it unsuitable for a display with a need for a relatively narrow line width and a precise pattern.

Moreover, there has been proposed a method which comprises coating a photoresist containing an electroless plating catalyst, exposing and developing the same to form an electroless plating catalyst pattern and then conducting electroless plating (see, for example, Patent Document 4). However, a conductive film has a visible light transmittance of 72% and, therefore, only an insufficient transparency can be obtained thereby. Moreover, this method suffers from a problem in the production cost, i.e., highly expensive palladium should be employed as the electroless plating catalyst for removing most of the exposed part after the exposure.

(3) Mesh Obtained by Etching Process Using Photolithographic Technique

There has been proposed a method wherein a thin metal mesh film is formed on a transparent substrate by etching process using a photolithographic technique (see, for example, Patent Documents 5 to 8 and so on). Because of enabling fine processing, this method is advantageous in forming a mesh having a high aperture ratio (a high transmittance) and being capable of shielding even strong electromagnetic release. On the other hand, it suffers from a problem that the production process is troublesome and complicated and, therefore, costs high. Further, it is known that because of using the etching procedure, the lattice pattern has a problem that the intersecting points have broader line width than straight line parts. Furthermore, it has been pointed out that this method suffers from the problem of moire that should be overcome.

(4) Mesh Obtained by Copper-Plating on Conductive Metallic Silver and Development Sliver Using Silver Halide There has been proposed a method of forming a conductive mesh with the use of conductive metallic silver obtained by developing a silver halide or a method of forming a conductive mesh by plating a mesh-like developed silver obtained by developing a silver halide with metallic copper (see, for example, Patent Documents 9 and 10).

In order to prevent malfunctions in, for example, remote controls, near infrared ray-cutting function is considered as an important factor required for the electromagnetic wave shielding films and PDP as described above, as reported in Patent Document 11 and Patent Document 12.

Patent Document 1: JP-A-5-327274

Patent Document 2: JP-A-11-170420

Patent Document 3: JP-A-5-283889

Patent Document 4: JP-A-11-170421

Patent Document 5: JP-A-2003-46293

Patent Document 6: JP-A-2003-23290

Patent Document 7: JP-A-5-16281

Patent Document 8: JP-A-10-338848

Patent Document 9: JP-A-2004-207001

Patent Document 10: JP-A-2004-221564

Patent Document 11: JP-A-9-247581

Patent Document 12: JP-A-10-75087

DISCLOSURE OF THE INVENTION

Problems that the Invention is to Solve

Compared with the process for producing a mesh by etching using the photolithography, a metal mesh obtained by the silver salt photography with the use of a silver halide as described above is advantageous in that it can be produced via a smaller number of steps at a lower production cost and, moreover, shows little light scattering and has a low haze.

With the recent improvement in the PDP luminance, on the other hand, near infrared rays are generated in an increased amount. Therefore, it has been required to improve the near infrared ray cutting function.

In addition, the methods that are disclosed in the above Patent Documents suffer from the following problems.

(Low Productivity in Electroless Plating Process)

A light transmitting conductive film produced by, for example, a photographic sensitive material with the use of a silver salt disclosed in Patent Document 10 is advantageous in being capable of precisely forming a thin line pattern, thus achieving a high light transmittance, allowing mass production at a low cost and so on. Because of having a high resistance of the developed silver mesh, however, the thus obtained film can be hardly subjected to direct electrolytic plating. In the case of plating such a film having a large area, it is therefore needed to employ both of electroless plating and electrolytic plating. When electroless plating and electrolytic plating are used together, however, there arise some problems such as a lowering in the productivity and an increase in the plating cost.

When the electrolytic plating is conducted batchwise by using a sheet feeding system including the technique disclosed by Patent Document 10, there frequently arises a problem that, in a film having a surface resistivity of 1Ω/ or higher, an area close to the side of passing an electric current is plated at a hither extent in the part being in contact with a plating solution. This phenomenon, which is particularly obvious at the initiation of plating, i.e., at the first power feeding, makes it difficult to form a uniform plating layer even though the plating is continued thereafter. This problem becomes more serious with an increase in the surface resistivity.

(Low Productivity Caused by Discontinuous Mesh Pattern)

A mesh having a single pattern continuing 3 m or longer cannot be formed by the currently available mesh-forming methods excluding the fiber method disclosed by Patent Document 1. In the method with the use of screen printing, for example, a mesh pattern is formed by repeatedly printing a pattern in the screen plate size. As a result, the obtained pattern is interrupted with each screen plate size unit or overlapped parts are formed. That is to say, it is impossible by this method to completely form a printing pattern while forming neither a joint nor break in continuity. In the photolithography, a mesh is interrupted with each exposure mask size unit. Namely, a pattern formed by photolithography has a mesh pattern-free part. This is because the exposure is conducted with the use of a sheet type photomask and thus the exposure of a photoresist in a long roll film cannot be continuously exposed overall and it is unavoidable to repeatedly conduct exposure in an area corresponding to the photomask size.

For using in a PDP, for example, it has been a common practice to employ a production method wherein the mesh pattern of a constructed shield material is positioned with the module or front panel of the PDP or an optical filter having a base made of glass or the like. This method causes significant loss in the shield material. When it is intended to use a shield material connected and wound into a roll for improving productivity, furthermore, it takes a long time to position and thus the production speed cannot be sufficiently elevated.

The near infrared ray cutting function can be imparted by, for example, bonding a functional layer to an electromagnetic wave shielding film. So long as an optical filter is manufactured by using an electromagnetic wave shielding film in the interrupted state as described above and causing significant loss, a film having the near infrared ray cutting function also suffers from the disadvantage of being available only in the interrupted state.

An object of the present invention, which has been completed under these circumstances, is to solve the above-described problems relating to the improvement in the performance of an electromagnetic wave shielding film. More specifically speaking, the invention aims at providing a light transmitting electromagnetic wave shielding film carrying a continuous mesh pattern, which is excellent in durability, has high electromagnetic wave shielding properties, shows little light scattering and has a high light transmittance, at a high productivity and a low price while minimizing loss in the shield material.

Another object of the present invention is to provide a light transmitting electromagnetic wave shielding film which achieves both of excellent electromagnetic wave shielding properties and an excellent near infrared ray cutting function.

Still another object of the present invention is to provide an optical filter and a plasma display panel, which achieve both of excellent electromagnetic wave shielding properties and an excellent near infrared ray cutting function, by using such a light transmitting electromagnetic wave shielding film.

Means for Solving the Problems

The problems as discussed above have been solved by the following inventions.

(1) A light transmitting electromagnetic wave shielding film, which has a metallic silver part and a light transmitting part, which are formed by exposing an emulsion layer containing a silver salt emulsion formed on a support and then developing, and wherein the light transmitting electromagnetic wave shielding film has infrared ray shielding properties.

(2) The light transmitting electromagnetic wave shielding film as described in (1) above, which comprises an infrared ray absorbing dye in the support.

(3) The light transmitting electromagnetic wave shielding film as described in (1) above, which comprises an infrared ray absorbing dye in a layer formed on the support.

(4) The light transmitting electromagnetic wave shielding film as described in (3) above, which comprises the infrared ray absorbing dye in a layer formed on the support in the opposite side to the metallic silver part.

(5) The light transmitting electromagnetic wave shielding film as described in (3) above, which comprises the infrared ray absorbing dye in a layer formed on the support in the same side as the metallic silver part.

(6) The light transmitting electromagnetic wave shielding film as described in (1) above, which has an adhesive layer and comprises an infrared ray absorbing dye in the adhesive layer.

(7) The light transmitting electromagnetic wave shielding film as described in any of (1) to (6) above, which has a conductive metal part carrying a conductive metal in the metallic silver part which is formed by applying a physical development and/or a plating process to the metallic silver part.

(8) The light transmitting electromagnetic wave shielding film as described in (7) above, wherein the conductive metal part is made up of mesh-forming thin lines of from 1 µm to 40 µm in size and the mesh pattern continues for 3 m or longer.

(9) The light transmitting electromagnetic wave shielding film as described in any of (1) to (8) above, wherein the exposure is conducted by scan-exposing the support provided with the emulsion layer containing a silver salt emulsion with a light beam while transporting the support.

(10) The light transmitting electromagnetic wave shielding film as described in any of (1) to (9) above, wherein a silver mesh obtained by developing the emulsion layer has a surface resistivity of from 1 to 1000Ω/ and is electrolytically plated continuously at a transport speed of 1 to 30 m/min after the development treatment.

(11) The light transmitting electromagnetic wave shielding film as described in any of (3) to (10) above, wherein the layer containing the infrared ray absorbing dye or a layer in contact with the layer containing the infrared ray absorbing dye contains an antistatic agent containing an inorganic oxide.

(12) An optical filter, which comprises the light transmitting electromagnetic wave shielding film as described in any of (1) to (11) above.

(13) A plasma display panel, which comprises the light transmitting electromagnetic wave shielding film as described in any of (1) to (11) above or the optical filter as described in (12) above.

ADVANTAGE OF THE INVENTION

According to the invention, it is possible to provide a light transmitting electromagnetic wave shielding film, which is excellent in durability, conductivity and light transmission properties, shows little light scattering and achieves both of excellent electromagnetic wave shielding properties and an excellent near infrared ray cutting function. The invention can further provides the light transmitting electromagnetic wave shielding film as described above which comprises a mesh having a continuous mesh pattern.

By using this light transmitting electromagnetic wave shielding film, the invention can also provide an optical filter and a plasma display panel having both of excellent electromagnetic wave shielding properties and an excellent near infrared ray cutting function.

According to the invention, moreover, these products can be less expensively provided on a large scale without causing considerable loss in the production.

Figure 1:
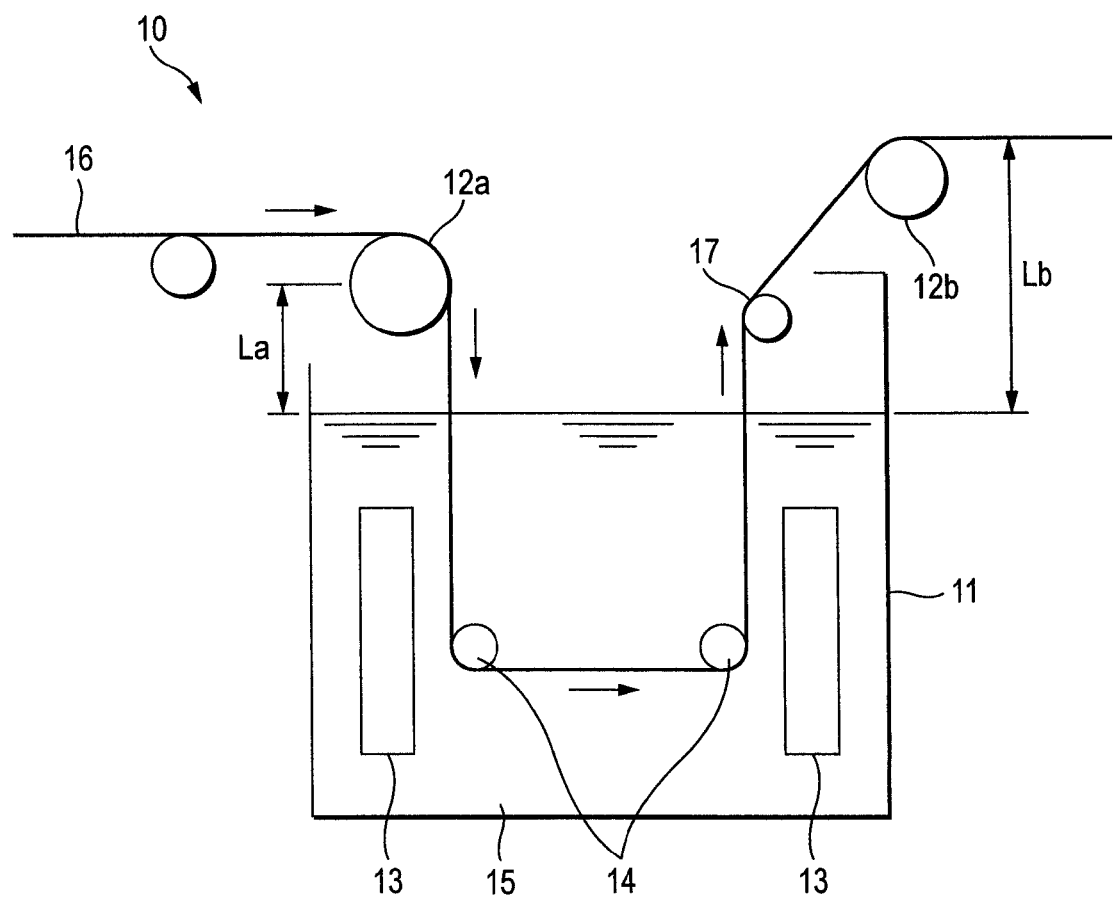
FIG. 1 is a model view showing an example of an electrolytic plating tank appropriately usable in the electrolytic plating process in the invention.

| DESCRIPTION OF THE REFERENCE NUMERALS | |
|---|---|
| 10 | Electrolytic plating tank |
| 11 | Plating bath |
| 12a, 12b | Feeding rollers |
| 13 | Anode plate |
| 14 | Guide roller |
| 15 | Plating solution |
| 16 | Film |
| 17 | Draining roller |

BEST MODE FOR CARRYING OUT THE INVENTION

The term "electromagnetic wave shielding film" as used herein indicates a film which comprises a filmy support carrying an electromagnetic wave shielding film and at least one other functional film. In some cases, "an electromagnetic wave shielding film" is merely called "a film".

A laminated material comprising a plasma display member such as an optical filter or a glass base material carrying the same is called "an electromagnetic wave shielding laminate".

The term "mesh" in "a continuous mesh pattern" as used herein means a network pattern made up of multiple thin liens or a network made up of multiple thin liens based on the common practice in the art. The term "continuous" means a long film such as a rolled film wherein a single pattern is continuously formed in the lengthwise direction of the long film without interruption. The merits thereof will be discussed hereinafter.

The light transmitting electromagnetic wave shielding film according to the present invention is a light transmitting electromagnetic wave shielding film in which a metallic silver part and a light transmitting part are formed by exposing an emulsion layer containing a silver salt emulsion formed on a support and then developing and which is characterized by having infrared ray shielding properties.

[Constitution of Light Transmitting Electromagnetic Wave Shielding Film]

In the light transmitting electromagnetic wave shielding film according to the invention, the thickness of the support is preferably from 5 to 200 µm, more preferably from 30 to 150 µm. So long as the thickness of the support falls within the range of 5 to 200 µm, the desired visible light transmittance can be obtained and the film can be easily handled.

The thickness of the metallic silver part which is formed on the support before applying a physical development and/or a plating process can be appropriately determined depending on the coating thickness of the silver salt-containing coating to be coated on the support. The thickness of the metallic silver part is preferably 30 µm or less, more preferably 20 µm or less, more preferably from 0.01 to 9 µm and most preferably from 0.05 to 5 µm. A patterned metallic silver part is preferable. The metallic silver part may have either a monolayer structure or a laminated structure having two or more layers. In the case where the metallic silver part is a patterned and laminated structure having two or more layers, different color photosensitivities can be imparted to it so that it can be sensitized at various wavelengths. By exposing at various wavelengths, patterns differing from layer to layer can be formed.

In the case of using as an electromagnetic wave shielding material for a display, the conductive metal part preferably has an as small thickness as possible for increasing a viewing angle of the display. In the case of using as a conductive wiring material, a thinner film is required for achieving a higher density. From these points of view, the layer of the conductive metal carried on the conductive metal part preferably has a thickness less than 9 μm, more preferably 0.1 μm or more but less than 5 μm and further preferably 0.1 μm or more but less than 3 μm.

In the present invention, since it is possible to form a metallic silver part of a desired thickness by controlling the coating thickness of the silver salt-containing layer and to arbitrarily control the layer of the conductive metal grains by the physical development and/or the plating process, even a light transmitting electromagnetic wave shielding film of a thickness less than 5 μm, preferably less than 3 μm, can be easily formed.

In contrast to a known etching process in which a large part of the metal thin film has to be etched off and discarded, the present invention, being capable of forming a pattern containing a conductive metal of a necessary amount only on the support, can only utilize the metal of a necessary minimum amount, thereby attaining advantages of reductions in the production cost and in the amount of discarded metal.

[Method of Producing Light Transmitting Electromagnetic Wave Shielding Film]

The light transmitting electromagnetic wave shielding film according to the invention can be produced by exposing a photosensitive material having an emulsion layer containing a silver halide on a support, then conducting a development process to form a metallic silver part and a light transmitting part respectively in an exposed area and an unexposed area, and applying, if required, a physical development and/or a plating process to the metallic silver part thereby making the metallic silver part to carry a conductive metal.

The method of forming the light transmitting electromagnetic wave shielding film according to the invention preferably involves the following two modes depending on the photosensitive material and the development process employed.

(I) A mode wherein a photosensitive silver halide monochromic photosensitive material free from physical development nucleus is subjected to chemical development or heat development to thereby form a metallic silver part on the photosensitive material.

(II) A mode wherein a photosensitive silver halide monochromic photosensitive material containing physical development nuclei in the silver halide emulsion layer is subjected to dissolution physical development to thereby form a metallic silver part on the photosensitive material.

In the above-described embodiment (I) of the unified monochromic development type, metallic silver is formed on the photosensitive material. The developed silver thus obtained is chemically developed silver or thermally developed silver in the form of filaments having a large specific surface area. Thus, the subsequent plating is highly active in the course of the physical development.

In the embodiment (II), silver halide grains are dissolved around the physical development nuclei and deposited on the physical development nuclei in the exposed area. Thus, metallic silver is formed on the photosensitive material. This mode also falls within the category of the unified monochromic development type. Although the development process causes deposition on the physical development nuclei and thus achieves a high activity, the developed silver is in the form of spheres having a small surface area.

In each of these modes, selection may be made of the negative development or the reversal development.

The terms "chemical development", "heat development" and "dissolution physical development" as used herein have the meanings commonly employed in the art. These terms are illustrated in photochemical texts generally employed, for example, *Shashin Kagaku*, Shinichi Kikuchi (Kyoritsu Shuppan, 1955) and *The Theory of Photographic Processes*, 4th ed., ed. by C. E. K. Mees (Mcmillan, 1977). Although liquid processing is employed herein, the heat development system is also usable as the development system in other applications. Namely, use can be made of, for example, JP-A-2004-184693, JP-A-2004-334077, JP-A-2005-010752, Japanese Patent Application 2004-244080 and Japanese Patent Application 2004-085655.

(1) Photosensitive Material (1-1) Support

As the support of the photosensitive material to be used in the production method according to the invention, use can be made of a plastic film, a plastic plate, a glass plate and so on.

As the material of the plastic film and plastic plate as described above, it is possible to use, for example, polyesters such as polyethylene terephthalate (PET) and polyethylene naphthalate; polyolefins such as polyethylene (PE), polypropylene (PP), polystyrene and EVA; vinyl-based resins such as polyvinyl chloride and polyvinylidene chloride; polyether ether ketone (PEEK), polysulfone (PSF), polyethersulfone (PES), polycarbonate (PC), polyamide, polyimide, acrylic resin, triacetyl cellulose (TAC) and so on.

In the present invention, it is preferable that the plastic film as described above is a polyethylene terephthalate film or a triacetyl cellulose (TAC) film from the viewpoints of transparency, heat resistance, easiness in handling and cost.

Since an electromagnetic wave shielding material for a display should be transparent, it is preferable that the support has a high transparency. In this case, the total visible light transmittance of the plastic film or the plastic plate is preferably from 70 to 100%, more preferably from 85 to 100% and particularly preferably from 90 to 100%. In the invention, it is also possible to use a plastic film or a plastic plate having been colored to such an extent as not to interfere the achievement of the objects of the invention.

The plastic film or plastic plate to be used in the invention may be either a monolayered one or a multilayered one comprising two or more layers combined together.

In the case of using a glass plate as the support in the invention, the kind of the glass is not particularly restricted. In the case of using as an electromagnetic wave shielding film for a display, it is preferable to use a hardened glass provided with a hardening layer on the surface. Compared with a non-hardened glass, a hardened glass can likely prevent breakage. A hardened glass obtained by the air-cooling method is still preferable from the viewpoint of safety, since it shatters into smaller pieces with non-sharp edges, if broken.

The thickness of the support is preferably 200 μm or less, more preferably 20 μm or more but not more than 180 μm and most preferably 50 μm or more but not more than 120 μm.

(1-2) Protective Layer

The photosensitive material to be used herein may have a protective layer formed on the emulsion layer as will be described hereinafter. The term "protective layer" as used herein means a layer which is made of a binder such as gelatin or a high molecular polymer and formed on the photosensitive emulsion layer so as to exert effects of preventing scuff marks and improving mechanical properties. Taking the plating process into consideration, it is preferable not to form the protective layer or minimize the thickness thereof, if formed.

The thickness of the protective layer is preferably 0.2 μm or less. The protective layer may be formed by any publicly known coating method without restriction.

(1-3) Emulsion Layer

It is preferable that the photosensitive material to be used in the production of the light transmitting electromagnetic wave shielding film according to the invention has an emulsion layer (a silver salt-containing layer) on the support. The emulsion layer in the invention may optionally contain a dye, a binder, a solvent and so on, in addition to the silver salt.

<Dye>

The photosensitive material may contain a dye at least in the emulsion layer. The dye is added to the emulsion layer for various purposes, i.e., as a filter dye, for preventing irradiation, or the like. As the dye, a solid dispersion dye may be contained. Examples of the dye preferably usable in the invention include the dyes represented by the general formulae (FA), (FA1), (FA2) and (FA3) as reported by JP-A-9-179243. More specifically speaking, compounds F1 to F34 cited in this patent document are preferred. Further, use may be preferably made of dyes (II-2) to (II-24) reported by JP-A-7-152112, dyes (III-5) to (III-18) reported by JP-A-7-152112, dyes (IV-2) to (IV-7) reported by JP-A-7-152112 and so on.

As other examples of the dye usable in the invention, there can be enumerated solid dyes in the form of fine solid grains that are to be bleached in the course of the development or fixation such as cyanine dyes, pyrylium dyes and aminium dyes reported by JP-A-3-138640. Examples of a dye not bleached in processing include a cyanine dye having carboxyl group reported by JP-A-9-96891, an acid group-free cyanine dye reported by JP-A-8-245902, a lake type cyanine dye reported by JP-A-8-333519, a cyanine dye reported by JP-A-1-266536, a hollow porous type cyanine dye reported by JP-A-3-136038, a pyrylium dye reported by JP-A-62-299959, a polymer type cyanine dye reported by JP-A-7-253639, a fine solid grain dispersion of an oxonol dye reported by JP-A-2-282244, light-scattering grains reported by JP-A-63-131135, a Yb3+ compound reported by JP-A-9-5913, an ITO powder reported by JP-A-7-113072 and so on. Also, use can be made of dyes represented by the general formulae (F1) and (F2) reported by JP-A-9-179243, more specifically speaking, compounds F35 to F112 cited in this patent document.

The dyes as described above include water-soluble dyes. Examples of these water-soluble dyes include an oxonol dye, a benzylidene dye, a melocyanine dye, a cyanine dye and an azo dye. Among all, an oxonol dye, a hemioxonol dye and a benzylidene dye are particularly useful in the invention. Specific examples of the water-soluble dyes usable in the invention include those reported by British Patent 584,609, ibid. 1,177,429, JP-A-48-85130, JP-A-49-99620, JP-A-49-114420, JP-A-52-20822, JP-A-59-154439, JP-A-59-208548, U.S. Pat. Nos. 2,274,782, ibid. 2,533,472, ibid. 2,956,879, ibid. 3,148,187, ibid. 3,177,078, ibid. 3,247,127, ibid. 3,540, 887, ibid. 3,575,704, ibid. 3,653,905 and ibid. 3,718,427.

The content of the dye in the emulsion layer preferably ranges from 0.01 to 10% by mass based on the total solid matters, more preferably from 0.1 to 5% by mass from the viewpoints of the effect of preventing irradiation and lowering in sensitivity due to an increase in the content thereof.

<Silver Salt>

As the silver salt to be used in the invention, there can be enumerated inorganic silver salts such as a silver halide. It is preferable in the invention to use a silver halide which has excellent characteristics as a photosensor.

Next, the silver halide preferably usable in the invention will be described.

It is preferable in the invention to use a silver halide so as to make it serving as a photosensor. Thus, techniques concerning a silver halide that have been employed in silver halide photofilms, photographic papers, plate-making films, emulsion masks for photomasking, etc. are also usable in the invention.

The halogen element to be contained in the silver halide as described above may be any one of chlorine, bromine, iodine and fluorine. Also, use may be made of a combination of these elements. For example, it is preferable to use a silver halide comprising, as the main component, AgCl, AgBr or AgI. It is still preferable to use a silver halide comprising AgBr or AgCl as the main component. It is also preferable to use a mixture of silver chloride with silver bromide, a mixture of silver iodide with silver chloride and silver bromide or a mixture of silver iodide with silver bromide. It is more preferable to use a mixture of silver chloride with silver bromide, silver bromide, a mixture of silver iodide with silver chloride and silver bromide or a mixture of silver iodide and silver bromide. It is most preferable to use a mixture of silver chloride and silver bromide or a mixture of silver iodide with silver chloride and silver bromide containing 50% by mol or more of silver chloride.

The expression "a silver halide containing AgBr (silver bromide) as the main component" as used herein means a silver halide in which the molar ratio of bromide ion in the silver halide composition amounts to 50% or more. The silver halide grains containing AgBr as the main component may contain bromide ion and chloride ion in addition to the bromide ion.

The silver halide is in the form of solid grains. Considering the image qualities in the patterned metallic silver layer that is formed after the exposure and the development processes, it is preferable that the average grain size of the silver halide expressed in sphere-corresponding diameter is from 0.1 to 1000 nm (1 μm), more preferably from 0.1 to 100 nm and more preferably from 1 to 50 nm.

The term "sphere-corresponding diameter" of silver halide grains means the diameter of a spherical grain having the same volume.

The amount f the silver salt contained in the emulsion layer is preferably from 0.1 to 80% by mass, more preferably from 1 to 50% by mass and more preferably from 3 to 30% by mass.

The silver halide grains are not particularly restricted in shape. Namely, they may be in various shapes such as sphere, cube, plates (hexagonal plate, triangular plate, square plate, etc.), octagon, 14-hedron and so on. Cube or 14-hedron is preferable.

A silver halide grain may be composed of the interior and the surface area as a homogeneous phase. Alternatively, it may have a local layer having a different halogen composition either as the interior or the surface.

The silver halide emulsion to be used as a coating solution for emulsion layer in the invention can be prepared by using a method reported by, for example, G. Glafkides, *Chimie et Physique Photographique* (Paul Montel, 1997), G. F. Dufin, *Photographic Emulsion Chemistry* (The Forcal Press, 1966), V. L. Zelikman et al., *Making and Coating Photographic Emulsion* (The Forcal Press, 1964), etc.

As a method of preparing the silver halide emulsion as described above, either an acidic method or a neutral method may be used. As a method of reacting a soluble silver salt with a soluble halogen salt, use may be made of either a one-side mixing method, a simultaneous mixing method or a combination thereof.

To form silver grains, it is also possible to employ the method of forming the grains in the presence of excessive silver ion (i.e., the so-called reverse mixing method). As one of the simultaneous mixing methods, moreover, it is possible to employ the method wherein pAg is maintained at a constant level in the liquid phase for forming the silver halide, i.e., the so-called controlled double-jet method.

It is also preferable to form grains by using a so-called silver halide solvent such as ammonia, thioether or tetrasubstituted thiourea. In these methods, it is particularly preferable to use a tetra-substituted thiourea compound as reported by JP-A-53-82408 and JP-A-55-77737. Preferable examples of the tetra-substituted thiourea compound include tetramethyl thiourea and 1,3-dimethyl-2-imidazolinethione. Although the amount of the silver halide solvent to be added varies depending on the kind of the compound employed, the desired grain size and halogen composition, it preferably ranges from $10^{-5}$ to $10^{-2}$ mol per mol of the silver halide.

By using the controlled double-jet method or the method of forming grains by using a silver halide solvent as described above, a silver halide emulsion having a regular crystal form and a narrow grain size distribution can be easily obtained. Therefore, these methods are preferably usable in the invention.

To uniformize the grain size, it is preferable to allow the quick growth of silver within a range not exceeding the critical saturation by using the method of varying the speed of adding silver nitride or an alkali halide depending on the grain growth speed as reported by British Patent 1,535,016, JP-B-48-36890 and JP-B-52-16354, or the method of varying the concentration of an aqueous solution as reported by British Patent 4,242,445 and JP-A-55-158124. The silver halide emulsion to be used in forming the emulsion layer in the invention is preferably a monodisperse emulsion preferably having a coefficient of variation represented by {(standard deviation of grain size)/(average grain size)}×100 of 20% or less, more preferably 15% or less and most preferably 10% or less.

The silver halide emulsion to be used in the invention may be a mixture of a plurality of silver halide emulsions having different grain sizes.

The silver halide emulsion to be used in the invention may contain a metal belonging to the VII or VIIB group. To achieve a high contrast and a low fog, it is particularly preferable to contain a rhodium compound, an iridium compound, a ruthenium compound, an iron compound, an osmium compound, etc. These compounds may have various ligands. Examples of the ligands include a cyanide ion, a halogen ion, a thiocyanate ion, a nitrosyl ion, water, a hydroxide ion and so on. In addition to these pseudohalogens and ammonia, use may be also made of organic molecules such as amines (methylamine, ethylenediamine, etc.), heterocyclic compounds (imidazole, thiazole, 5-methyl thiazole, mercaptoimidazole, etc.), urea and thiourea.

To elevate the sensitivity, it is advantageous to use a metal hexacyanide complex dope such as $K_4[Fe(CN)_6]$, $K_4[Ru(CN)_6]$ or $K_3[Cr(CN)_6]$.

As the rhodium compound as described above, use can be made in the invention a water-soluble rhodium compound. Examples of the water-soluble rhodium compound include a rhodium (III) halide, a hexachlororhodium (III) complex salt, a pentachloro acorhodium complex salt, a tetrachloro diagnorhodium complex salt, a hexabromorhodium (III) complex salt, a hexamine rhodium (III) complex salt, a trioxalatorhodium (III) complex salt, and $K_3Rh_2Br_9$.

Such a rhodium compound is employed by dissolving in water or a suitable solvent. It is also possible to employ a common method for stabilizing the solution of the rhodium compound, namely a method of adding an aqueous solution of a hydrogen halide (such as hydrochloric acid, hydrobromic acid or hydrofluoric acid) or an alkali halide (such as KCl, NaCl, KBr or NaBr). It is also possible, instead of employing a water-soluble rhodium compound, to add and dissolve, at the preparation of silver halide, other silver halide grains having been doped with rhodium.

Examples of the above-described iridium compound include a hexachloroiridium complex salt such as $K_2IrCl_6$ or $K_3IrCl_6$, a hexabromoiridium complex salt, a hexaammineiridium complex salt and a pentachloronitrisil iridium complex salt.

Examples of the ruthenium compound as described above include hexachlororuthenium, pentachloro nitrosyl ruthenium, and $K_4[Ru(CN)_6]$.

Examples of the iron compound as described above include potassium hexacyanoferrate (II) and ferrous thiocyanate.

Ruthenium or osmium is added in the form of a water-soluble complex salt as described in JP-A-63-2042, JP-A-1-285941, JP-A-2-20852 and JP-A-2-20855. As particularly preferable example, a 6-coordination complex represented by the following formula can be cited:

$$[ML_6]^{-n}$$

wherein M represents Ru or Os; and n represents 0, 1, 2, 3 or 4.

In this case, a counter ion is not important and can for example be ammonium of an alkali metal ion. Also a preferable examples of the ligand include a halide ligand, a cyanide ligand, an oxycyanide ligand, a nitrosyl ligand and a thionitrosyl ligand. Next, specific examples of the complex usable in the invention will be shown, but the invention is not limited to such examples.

$[RuCl_6]^{-3}$, $[RuCl_4(H_2O)_2]^{-1}$, $[RuCl_5(NO)]^{-2}$, $[RuBr_5(NS)]^{-2}$, $[Ru(CO)_3Cl_3]^{-2}$, $[Ru(CO)Cl_5]^{-2}$, $[Ru(CO)Br_5]^{-2}$, $[OsCl_6]^{-3}$, $[OsCl_5(NO)]^{-2}$, $[Os(NO)(CN)_5]^{-2}$, $[Os(NS)Br_5]^{-2}$, $[Os(CN)_6]^{-4}$ and $[Os(O)_2(CN)_5]^{-4}$.

Such a compound is preferably added in an amount of $10^{-10}$ to $10^{-2}$ mol/mol.Ag per mol of silver halide, more preferably $10^{-9}$ to $10^{-3}$ mol/mol.Ag.

It is also preferable in the invention to use a silver halide containing a Pd (II) ion and/or a Pd metal. Pd may be uniformly distributed within a silver halide grain, but is preferably contained in the vicinity of a surface layer of the silver halide grain. The expression that Pd is "contained in the vicinity of a surface layer of the silver halide grain" means that the silver halide grain has a layer with a higher palladium content than in other layers, within a depth of 50 nm from the surface of the silver halide grain.

Such a silver halide grain can be prepared by adding Pd in the course of forming the silver halide grain, and it is preferable to add Pd after silver ions and halogen ions are added by more than 50% of the total addition amounts. It is also preferable that Pd (II) ions are made present in the surface layer of silver halide by adding Pd (II) ions in a post-ripening stage.

Such Pd-containing silver halide grains increase a speed of a physical development or an electroless plating to thereby improve the production efficiency of the desired electromagnetic wave shielding material. As a result, they contribute to a reduction of the production cost. Pd has been well known and employed as a catalyst for electroless plating, and, in the present invention, it is possible to localize Pd in the surface layer of the silver halide grains, thereby saving extremely expensive Pd.

In the invention, Pd ions and/or Pd metal preferably has a content, in the silver halide, of $10^{-4}$ to 0.5 mole/mol.Ag with respect to a number of moles of silver in silver halide, more preferably 0.01 to 0.3 mole/mol.Ag.

Examples of the Pd compound to be employed include $PdCl_4$ and $Na_2PdCl_4$.

In the invention, a chemical sensitization practiced in photographic emulsion can be conducted so as to further improve the sensitivity as the photosensor. As the chemical sensitization, use can be made of a chalcogen sensitization such as sulfur sensitization, selenium sensitization or tellurium sensitization, a precious metal sensitization such as gold sensitization, or a reduction sensitization. Such sensitization may be employed either singly or in combination. In case of employing a combination of chemical sensitizations as cited above, for example a combination of sulfur sensitization with gold sensitization, a combination of sulfur sensitization with selenium sensitization and gold sensitization, or a combination of sulfur sensitization with tellurium sensitization and gold sensitization is preferable.

The sulfur sensitization is normally conducted by adding a sulfur sensitizer and agitating the emulsion for a definite period of time at a high temperature of 40° C. or above. As the sulfur sensitizer, use can be made of a known sulfur compound, for example, a sulfur compound contained in gelatin or various sulfur compounds such as a thiosulfate salt, a thiourea, a thiazole or a rhodanine. A preferred sulfur compound is a thiosulfate salt or a thiourea compound. The amount of the sulfur sensitizer to be added is variable depending on various conditions such as a pH and a temperature at the chemical ripening, and a grain size of the silver halide, and is preferably $10^{-7}$ to $10^{-2}$ mol per mol of silver halide, more preferably $10^{-5}$ to $10^{-3}$ mol.

As the selenium sensitizer to be employed in the selenium sensitization, use can be made of a known selenium compound. The selenium sensitization is normally conducted by adding an unstable and/or non-unstable selenium compound and agitating the emulsion for a definite period time at a high temperature of 40° C. or above. As the unstable selenium compound, use can be made of those described in JP-B-44-15748 JP-B-43-13489, JP-A-4-109240 and JP-A-4-324855. It is particularly preferable to use compounds represented by general formulas (VIII) and (IX) in JP-A-4-324855.

A tellurium sensitizer employed in the tellurium sensitization is a compound capable of generating silver telluride, which is assumed to constitute a sensitizing nucleus, on the surface or in the interior of silver halide grains. A silver telluride generating speed in the silver halide emulsion can be tested by a method described in JP-A-5-313284. Specific examples of the compound include those described in U.S. Pat. No. 1,623,499, ibid. No. 3,320,069, ibid. No. 3,772,031, British Patent No. 235,211, ibid. No. 1,121,496, ibid. No. 1,295,462, ibid. No. 1,396,696, Canadian Patent No. 800,958, JP-A-4-204640, JP-A-4-271341, JP-A-4-333043, JP-A-5-303157, *J. Chem. Soc. Chem. Commun.*, 635 (1980), ibid., 1102 (1979), ibid., 645 (1979), *J. Chem. Soc. Perkin. Trans.*, 1, 2191 (1980), S. Patai, *The Chemistry of Organic Selenium and Tellurium Compounds*, Vol. 1 (1986), and ibid., Vol. 2 (1987). Among all, compounds represented by the general formulas (II), (III) and (IV) in JP-A-5-313284 are preferred.

The amount of the selenium sensitizer or the tellurium sensitizer employable in the invention varies depending on the silver halide grains to be used and the condition of chemical ripening. In general, it ranges from $10^{-8}$ to $10^{-2}$ mol per mol of the silver halide, preferably from $10^{-7}$ to $10^{-3}$ mol. The chemical sensitization in the invention is not particularly restricted in the conditions, but is usually conducted at a pH of 5 to 8, a pAg of 6 to 11, preferably 7 to 10 and a temperature of 40 to 95° C., preferably 45 to 85° C.

As the precious metal sensitizer, there can be employed gold, platinum, palladium or iridium, among which gold sensitization is particularly preferable. Examples of a gold sensitizer to be employed in the gold sensitization include chloroautic acid, potassium chloroaurate, potassium aurithiocyanate, gold sulfide, thioglucose gold (I) and thiomannose gold (I). Such a gold sensitizer can be employed in an amount of about $10^{-7}$ to about $10^{-2}$ mol per mol of the silver halide. In the silver halide emulsion to be employed in the invention, a cadmium salt, a sulfite salt, a lead salt or a thallium salt may be included in the process of the formation of silver halide grains or of the physical ripening.

In the present invention, use can be also made of a reduction sensitization. As a reduction sensitizer, it is possible to employ a stannous salt, an amine, formamidinesulfinic acid or a silane compound. The silver halide emulsion may contain a thiosulfonic acid compound by a method described in European Patent (EP) No. 293917. The silver halide emulsion to be employed in the preparation of the photosensitive material to be used in the invention may be a single emulsion or a combination of two or more emulsions (for example, those differing in an average grain size, a halogen composition, a crystalline state, a condition of chemical sensitization or a sensitivity). In order to achieve a high contrast, it is preferable, as described in JP-A-6-324426, to coat an emulsion of a higher sensitivity in a position closer to the support.

<Binder>

In the emulsion layer, use can be made of a binder for the purposes of uniformly dispersing the silver salt grains and assisting an adhesion between the emulsion layer and the support. As the binder in the invention, either a water-insoluble polymer or a water-soluble polymer is usable, though a water-soluble polymer is preferred.

Examples of the binder include gelatin, polyvinyl alcohol (PVA), polyvinylpyrrolidone (PVP), a polysaccharide such as starch, cellulose and a derivative thereof, polyethylene oxide, a polysaccharide, a polyvinylamine, chitosan, polylysine, polyacrylic acid, polyalginic acid, polyhyaluronic acid, carboxycellulose and so on. These materials have a neutral, anionic or cationic property depending on the ionic property of the functional group.

The amount of the binder contained in the emulsion layer is not particularly restricted, and can be suitably selected within a range of exerting the dispersibility and the adhesion.

<Solvent>

A solvent to be employed in forming the above-described emulsion layer is not particularly restricted. For example, use can be made of water, an organic solvent (for example an alcohol such as methanol, a ketone such as acetone, an amide such as formamide, a sulfoxide such as dimethyl sulfoxide, an ester such as ethyl acetate, or an ether), an ionic liquid or a mixture thereof.

In the emulsion layer of the invention, the solvent is employed in an amount within a range of 30 to 90% by mass with respect to the total mass of the silver salt, the binder and the like contained in the emulsion layer, preferably within a range of 50 to 80% by mass.

(2) Individual Steps (2-1) Exposure

In the invention, an exposure is conducted to a photosensitive material coated with a silver salt-containing layer provided on the support. The exposure can be conducted with an electromagnetic wave The electromagnetic wave can be, for example, a light such as visible light or ultraviolet light, or a radiation such as X-ray. Also the exposure can be conducted with a light source having a wavelength distribution, or a light source of a specified wavelength.

As the light source, use can be made of various light emitting substances showing a light emission in a visible spectral region, if necessary. For example, a red light emitting substance, a green light emitting substance or a blue light emitting substance is employed either singly or in a mixture of two or more kinds. The spectral region is not limited to the aforementioned red, green and blue regions, and a fluorescent substance, emitting light in a yellow, orange, purple or infrared region, can also be employed. In particular, use is frequently made of a cathode ray tube emitting a white light by mixing these light emitting substances. A ultraviolet lamp is also preferred, and g-line or i-line of a mercury lamp is also usable.

In the invention, it is preferable to conduct the exposure by using various laser beams. For example, the exposure in the invention can be preferably conducted by a scanning exposure method utilizing monochromatic high-density light of a gas laser, a light-emitting diode, a semiconductor laser, of a second harmonic generator (SHG) consisting of a combination of a semiconductor laser or a solid-state laser employing a semiconductor laser as an exciting light source and a non-linear optical crystal. Further, use can be also made a KrF excimer laser, an ArF excimer laser or an F2 laser therefor. For obtaining a compact and inexpensive system, it is preferable to conduct the exposure with the use of a semiconductor laser or a second harmonic generator (SHG) consisting of a combination of a semiconductor laser or a solid-state laser and a non-linear optical crystal. In order to design a particularly compact, inexpensive, long-life and highly stable apparatus, it is most desirable to conduct the exposure with the use of a semiconductor laser.

In the case of using a silver halide, the exposure energy is preferably 1 mJ/cm$^2$ or less, more preferably 100 μJ/cm$^2$ or less and more preferably 50 μJ/cm$^2$ or less.

Specific examples of the laser light source include a blue semiconductor laser of a wavelength of 430 to 460 nm (published by Nichia Chemical Co. at 48th United Meeting of Applied Physics (March, 2001); a green light laser of about 530 nm which is obtained by a wavelength conversion of a light of a semiconductor laser (oscillation wavelength of about 1060 nm) by a LiNbO$_3$ SHG crystal having a waveguide-type inverted domain structure; a red semiconductor laser of a wavelength of about 685 nm (Hitachi type: HL6738MG); and a red semiconductor laser of a wavelength of about 650 nm (Hitachi type: HL6501MG).

A pattern exposure of the silver salt-containing layer can be conducted by a scanning exposure with a laser beam (also called a light beam) while transporting a support (also called a film) provided with an emulsion layer containing the silver salt emulsion as described above. In particular, it is preferable to use a capstan laser scanning exposure device reported by JP-A-2000-39677. It is also preferred to employ a DMD in a light beam scanning system reported by JP-A-2000-1244 as a substitute for the beam-scanning under polygon mirror rotation in this capstan system.

Concerning the scanning method with the light beam, it is preferable to employ a method wherein the exposure is conducted by using linear light sources aligned substantially perpendicular to the transport direction or a rotational polygon mirror. In this case, the light intensity of the light beams should be modulated to have two or more values. A straight line is patterned as continuous dots. Because of being continuous dots, the thin line of a single dot has a stepwise edge. The thickness of the thin line corresponds to the width at the narrowest portion.

As another light scanning method, it is also preferable to scan light beams inclined to the transport direction fitting for the inclination of the lattice pattern. In this case, it is preferable to orthogonalize two scanning light beams so that the light intensity of the light beams on the exposure face becomes substantially 1.

(2-2) Developing Process

In the invention, a development process is conducted after the exposure of the emulsion layer. The development process can be conducted with the use of an ordinary technique employed in developing a silver halide photographic film or paper, a lithographic film, an emulsion mask for photomask or the like. A developing solution is not particularly restricted, and use can be made of a PQ developer, an MQ developer or an MAA developer. It is also possible to employ a commercially available product, for example, a developing solution or a developing solution in a kit, such as CN-16, CR-56, CP45X, FD-3 or Papitol manufactured by Fuji Film Co., or C-41, E-6, RA-4, D-19 or D-72 manufactured by Eastman Kodak Co. Also a lithographic developing solution can be employed. As the lithographic developing solution, use can be made of, for example, D85 manufactured by Eastman Kodak Co. In the invention, a metallic silver part, preferably a patterned metallic silver part is formed in an exposed area, while a light transmitting part, which will explained hereinafter, is formed in an unexposed area by the exposure and the developing process as described above.

As the developing solution in the production method of the invention, use can be made of a developing agent of dihydroxybenzene type as the developing solution. Examples of the dihydroxybenzene developing agent include hydroquinone, chlorohydroquinone, isopropylhydroquinone, methylhydroquinone and hydroquinonemonosulfonate salt, among which hydroquinone is particularly preferable. As an auxiliary developing agent showing a super additivity with the above-described dihydroxybenzene developing agent, use can be made of a 1-phenyl-3-pyrrazolidone and a p-aminophenol. As the developing solution employed in the production method of the invention, use can be preferably made of a combination of a dihydroxybenzene developing agent with a 1-phenyl-3-pyrrazolidone or a combination of a dihydroxybenzene developing agent with a p-aminophenol.

Examples of a developing agent that can be combined with 1-phenyl-3-pyrrazolidone or a derivative thereof employed as the auxiliary developing agent include 1-phenyl-3-pyrrazolidone, 1-phenyl-4,4-dimethyl-3-pyrrazolidone, 1-phenyl-4-methyl-4-hydroxymethyl-3-pyrrazolidone and so on.

Examples of the auxiliary developing agent of p-aminophenol type include N-methyl-p-aminophenol, p-aminophenol, N-(β-hydroxyethyl)-p-aminophenol, N-(4-hydroxyphenyl)glycine and so on, among which N-methyl-p-aminophenol is preferred. The dihydroxybenzene developing agent is usually employed in an amount of 0.05 to 0.8 mol/liter, but is preferably employed, in the invention, in an amount of 0.23 mol/liter or higher, more preferably in an amount within a range of 0.23 to 0.6 mol liter. In the case of employing a combination of a dihydroxybenzene with a 1-phenyl-3-pyrrazolidone or a p-aminophenol, it is preferable to employ the former in an amount of 0.23 to 0.6 mol/liter, more preferably 0.23 to 0.5 mol/liter, and the latter in an amount of 0.06 mol/liter or less, more preferably 0.03 to 0.003 mol/liter.

In the invention, it is preferable that each of a development starter solution and a developer replenisher solution has a property of "showing a pH increase of 0.5 or less in the case of adding 0.1 mol of sodium hydroxide to 1 liter of the solution". This property of the development starter solution or the developer replenisher solution to be used can be confirmed by regulating the development starter solution or the developer replenisher solution to be tested at a pH value of 10.5, then adding 0.1 mol of sodium hydroxide to 1 liter of such solution and measuring the pH value of the solution. When the increase in the pH is 0.5 or less, the solution is evaluated as having the property as defined above. In the production method of the invention, it is preferable to use a development starter solution and a developer replenisher solution showing a pH increase of 0.4 or less in the above-described test.

To impart the above property to the development starter solution or the developer replenisher, a method utilizing a buffer is preferably employed. As the buffer, use can be made of a carbonate salt, boric acid described in JP-A-62-186259, a sugar (such as saccharose) described in JP-A-60-93433, an oxime (such as acetoxime), a phenol (such as 5-sulfosalicylic acid), or a tertiary phosphate salt (such as a sodium salt or a potassium salt), preferably a carbonate salt or boric acid. It is preferable to use the buffer (particularly carbonate salt) in an amount of 0.25 mol/liter or more, particularly preferably 0.25 to 1.5 mol/liter.

In the invention, the development starter solution preferably has a pH value of 9.0 to 11.0, particularly preferably 9.5 to 10.7. Also the pH values of the developer replenisher solution and the developing solution in a developing tank in a continuous processing fall within this range. To adjust pH, it is possible to use an alkali which is an ordinary water-soluble inorganic alkali metal salt (such as sodium hydroxide, potassium hydroxide, sodium carbonate or potassium carbonate).

In processing a photosensitive material of 1 $m^2$ in accordance with the production method of the invention, the content of the developer replenisher solution in the developing solution is 2000 ml or less, preferably 303 to 1000 ml and particularly preferably 50 to 600 ml. The developer replenisher solution may have the same composition as that of the development starter solution. Alternatively, it may have a higher concentration than that of the development starter solution concerning a component to be consumed in the development.

The developing solution for a developing process of the photosensitive material of the invention (hereinafter "development starter solution" and "developer replenisher solution" will be sometimes collectively referred to as "developing solution") may contain an ordinary additive (such as a stabilizer or a chelating agent). Examples of the stabilizer include a sulfite salt such as sodium sulfite, potassium sulfite, lithium sulfite, ammonium sulfite, sodium bisulfite, potassium metabisulfite, sodium formaldehyde bisulfite and so on. It is preferable to use the sulfite salt in an amount of 0.20 mol/liter or more, more preferably 0.3 mol/liter or more. However, it is preferable that the upper limit thereof is 1.2 mol/liter, since excessive addition thereof causes a silver stain in the developing solution. A particularly preferred range is 0.35 to 0.7 mol liter. It is also possible to use, as a stabilizer for a dihydroxybenzene developing agent, a small amount of an ascorbic acid derivative in combination with the sulfite salt. Examples of the ascorbic acid derivative include ascorbic acid, erysorbic acid which is a steric isomer thereof and an alkali metal salt thereof (such as sodium salt or potassium salt). As the ascorbic acid derivative, sodium erysorbate is preferably employed from the viewpoint of the material cost.

It is preferable to use the ascorbic acid derivative in an amount within a range of 0.03 to 0.12 in a molar ratio to the dihydroxybenzene developing agent, particularly preferably within a range of 0.05 to 0.01. In the case of employing an ascorbic acid derivative as the stabilizer, it is preferable that the developing solution preferably contains no boron compound.

Other additives usable in the developing solution include a development inhibitor such as sodium bromide or potassium bromide; an organic solvent such as ethylene glycol, diethylene glycol, triethylene glycol or dimethylformamide; a development promoter, for example, an alkanolamine such as diethanolamine or triethanolamine, imidazole or a derivative thereof; and a mercapto compound, an indazole compound, a benzotriazole compound or a benzoimidazole compound as an antifoggant or a black pepper spot preventing agent. Specific examples of the benzoimidazole compound as described above include 5-nitroindazole, 5-p-nitrobenzoylaminoindazole, 1-methyl-5-nitroindazole, 6-nitroindazole, 3-methyl-5-nitroindazole, 5-nitrobenzimidazole, 2-isopropyl-5-nitrobenzimidazole, 5-nitrobenzotriazole, sodium 4-[(2-mercapto-1,3,4-thiadiazol-2-yl)thio]butanesulfonate, 5-amino-1,3,4-thiadiazole-2-thiol, methylbenzotriazole, 5-methylbenzotriazole, 2-mercaptobenzotriazole and so on. The benzoimidazole compound is employed usually in a content of 0.01 to 10 mmol per liter of the developing solution, more preferably 0.1 to 2 mmol.

The developing solution may further contain an organic or inorganic chelating agent. Examples of the inorganic chelating agent include sodium tetrapolyphosphate, sodium hexametaphosphate and so on. As the organic chelating agent, use can be principally made of an organic carboxylic acid, an aminopolycarboxylic acid, an organic phosphonic acid, an aminophosphonic acid or an organic phopohonocarboxylic acid.

Examples of the organic carboxylic acid as described above include acrylic acid, oxalic acid, malonic acid, succinic acid, glutaric acid, adipic acid, pimelic acid, succinic acid, azelaic acid, sebacic acid, nonanedicarboxylic acid, decanedicarboxylic acid, undecanedicarboxylic acid, maleic acid, itaconic acid, malic acid, citric acid, tartaric acid and so on, though the invention is not restricted thereto.

Examples of the aminopolycarboxylic acid as described above include iminodiacetic acid, nitrilotriacetic acid, nitrilotripropionic acid, ethylenediamine monohydroxyethyltriacetic acid, ethylenediamine tetraacetic acid, glycol ether tetraacetic acid, 1,2-diaminopropane tetraacetic acid, diethylenetriamine pentaacetic acid, triethylenetetramine hexaacetic acid, 1,3-diamino-2-propanol tetraacetic acid, glycol ether diamine tetraacetic acid, and compounds described in JP-A-52-25632, JP-A-55-67747, JP-A-57-102624 and JP-B-53-40900.

Examples of the organic phosphonic acid include a hydroxyalkylidene diphosphonic acid described in U.S. Pat. No. 3,214,454, U.S. Pat. No. 3,794,591 and GP-A No. 2227639, or a compound described in Research Disclosure, vol. 181, Item 18170 (May 1979).

Examples of the aminophosphonic acid as described above include aminotris(methylenephosphonic acid), ethylenediamine tetramethylenephosphonic acid, aminotrimethylene phosphonic acid and so on. Also, use can be made of compounds described in Research Disclosure No. 18170, JP-A-57-208554, JP-A-54-61125, JP-A-55-29883 and JP-A-56-97347.

Examples of the phosphonocarboxylic acid include compounds described in JP-A-52-102726, JP-A-53-42730, JP-A-54-121127, JP-A-55-4024, JP-A-55-4025, JP-A-55-126241, JP-A-55-65955, JP-A-55-65956 and Research Disclosure No. 18170 as cited above. The chelating agent may be employed in the form of an alkali metal salt or an ammonium salt.

The chelating agent is preferably added in an amount of $1 \times 10^4$ to $1 \times 10^{-1}$ mol, more preferably $1 \times 10^3$ to $1 \times 10^2$ mol, per 1 liter of the developing solution.

The developing solution may further contain, as a silver stain preventing agent, a compound described in JP-A-56-24347 and JP-A-56-46585, JP-B-62-2849 and JP-A-4-362942. As an auxiliary solvent, use can be also made of a compound described in JP-A-61-267759. The developing solution may further contain a color toning agent, a surfactant, a defoamer, a hardening agent and the like, if necessary. A developing temperature and a developing time are mutually related and are determined depending on a total process time. In general, however, the developing temperature is preferably about 20 to about 50° C., more preferably 25 to 45° C. Also the developing time is preferably 5 seconds to 2 minutes, more preferably 7 to 90 seconds.

For the purposes of saving a transportation cost, a packing cost and a space of the developing solution, there is also preferred an embodiment of concentrating the developing solution and diluting it before using. To concentrate the developing solution, it is effective to employ potassium salts as the salts contained in the developing solution.

The development process in the invention can involve a fixing process which is conducted for the purpose of eliminating the silver salt in an unexposed area thereby achieving stabilization. The fixing process in the invention can be conducted by using a fixing technique commonly employed, for example, in a silver halide photographic film or paper, a lithographic film or an emulsion mask for photomask.

Preferable components of the fixing solution employed in the fixing step are as follows.

Namely, it is preferable that the fixing solution contains sodium thiosulfate or ammonium thiosulfate, and, if necessary tartaric acid, citric acid, gluconic acid, boric acid, iminodiacetic acid, 5-sulfosalicylic acid, glucoheptanoic acid, tiron, ethylenediamine tetraacetic acid, diethylenetriamine pentaacetic acid, nitrotriacetic acid, a salt thereof or the like. From the standpoint of recent environmental consideration, it is favorable to contain no boric acid. Examples of the fixing agent in the fixing solution to be employed in the invention include sodium thiosulfate, ammonium thiosulfate and so on. From the viewpoint of the fixing speed, ammonium thiosulfate is preferred. From the standpoint of recent environmental consideration, however, sodium thiosulfate may also be employed. Although the amount of such a known fixing agent may be appropriately varied, it generally ranges from about 0.1 to about 2 mol/liter, preferably 0.2 to 1.5 mol/liter. The fixing solution may contain, if desired, a hardening agent (such as a water-soluble aluminum compound), a stabilizer (such as a sulfite salt, or a bisulfite salt), a pH buffer (such as acetic acid), a pH regulating agent (such as ammonia or sulfuric acid), a chelating agent, a surfactant, a humidifying agent, a fixing promoter and so on.

Examples of the surfactant as described above include an anionic surfactant such as a sulfate compound or a sulfonated compound, a polyethylene-based surfactant, or an amphoteric surfactant described in JP-A-57-6740. Also the fixing solution may contain a publicly known defoaming agent.

Examples of the humidifying agent as described above include an alkanolamine, an alkylene glycol and so on. As the fixing promoter, it is also possible to use a thiourea derivative described in JP-B-45-35754, JP-B-58-122535 and JP-B-58-122536; an alcohol having a triple bond in the molecule; a thioether compound described in U.S. Pat. No. 4,126,459; a mesoion compound described in JP-A-4-229860; or a compound described in JP-A-2-44355. Examples of the pH buffer as described above include an organic acid such as acetic acid, malic acid, succinic acid, tartaric acid, citric acid, oxalic acid, maleic acid, glycolic acid, or adipic acid; and an inorganic buffer such as boric acid, a phosphate salt or a sulfite salt. The pH buffer is preferably acetic acid, tartaric acid or a sulfite salt. The pH buffer is employed for the purpose of preventing a pH increase in the fixing solution by a carry-over of the developing solution, preferably in an amount of 0.01 to 1.0 mol/liter, more preferably 0.02 to 0.6 mol liter. The fixing solution preferably has a pH value of 4.0 to 6.5, particularly preferably 4.5 to 6.0. As a dye dissolution promoter, it is also possible to use a compound described in JP-A-64-4739.

Examples of the hardening agent to be employed in the fixing solution of the invention include a water-soluble aluminum salt and a chromium salt. It is preferable that the hardening agent is a water-soluble aluminum salt, such as aluminum chloride, aluminum sulfate or potassium alum, and is preferably added in an mount of 0.01 to 0.2 mol/liter, more preferably 0.03 to 0.08 mol liter.

In the fixing step as described above, a fixing temperature is preferably about 20° C. to about 50° C., more preferably 25 to 45° C., while a fixing time is preferably 5 seconds to 1 minute, more preferably 7 to 50 seconds. A replenishing amount of the fixing solution is preferably 600 ml/m$^2$ or less to the processed amount of the photosensitive material, more preferably 500 ml/m$^2$ or less and particularly preferably 300 ml/m$^2$ or less.

The photosensitive material having been subjected to the developing and fixing processes is preferably subjected to a water-rinsing process or a stabilization process. In the water-rinsing process or the stabilization process, the rinsing is usually conducted with water in an amount of 20 liters or less per m$^2$ of the photosensitive material, with a replenishing amount of 3 liters or less (including 0, namely rinsing in a standing water bath). It is therefore possible not only to achieve a water saving but also to dispense with a piping in an automatic processor. For reducing the replenishing amount of rinsing water, there is already known a multi-step (2- or 3-step) countercurrent system. In the case of using such a multi-step countercurrent system in the production method of the invention, the photosensitive material after the fixing step is processed in succession in a proper direction, namely toward a processing solution less contaminated with the fixing solution, whereby a more efficient rinsing can be achieved. Also in the case of conducting the rinsing operation with a small amount of water, there is preferably provided a rinsing tank with a squeeze roller or a crossover roller as described in JP-A-63-18350 and JP-A-62-287252. Also in order to alleviate a pollution which may arise in the rinsing with a small amount of water, use may be made of a combination of an addition of various oxidants or a filtration with a filter. Also in such a method, an overflowing liquid from a rinsing bath or a stabilizing bath, resulting from a replenishment of the rinsing bath or the stabilizing bath with water including antimold means, or a part of such overflowing liquid may be utilized as a processing solution having a fixing ability in a preceding process step, as described in JP-A-60-235133. Also a water-soluble surfactant or a defoaming agent may be added in order to prevent a bubble pattern which tends to be generated in the rising with a small amount of water and/or a transfer of a processing component from the squeeze roller to the processed film.

Also in the water-rinsing process or the stabilization process, a dye adsorbent described in JP-A-63-163456 may be provided in the rinsing bath so as to prevent a stain by a dye dissolved from the photosensitive material. Also in the stabilizing process succeeding to the rinsing process, a bath containing a compound described in JP-A-2-201357, JP-A-2-132435, JP-A-1-102553 and JP-A-46-44446 may be employed as a final bath for the photosensitive material. In this case, it is possible to add, if necessary, an ammonium compound, a metal compound such as of Bi or Al, a fluorescent whitening agent, a chelating agent, a film pH regulating agent, a hardening agent, an antiseptic, an antimold agent, an alkanolamine or a surfactant. The water employed in the rinsing process or the stabilization process may be tap water, or preferably deionized water or water sterilized with a halogen, a ultraviolet sterilizing lamp or an oxidant (such as ozone, hydrogen peroxide or a perchlorate salt). It is also possible to employ rinsing water containing a compound described in JP-A-4-39652 and JP-A-5-241309. In the water-rinsing process or the stabilization process, it is preferable to employ a bath temperature of 0 to 50° C. and a bathing time of 5 seconds to 2 minutes.

The processing solution such as the developing solution or the fixing solution to be employed in the invention is preferably stored in a packaging material of a low oxygen permeability, as described in JP-A-61-73147. To reduce the replenishing amount, it is also preferable that a contact area of the processing tank with the air is made smaller to avoid evaporation of the solution and atmospheric oxidation. An automatic processor of a roller conveying type is described, for example, in U.S. Pat. Nos. 3,025,779 and 3,545,971, and will be simply referred to as a roller conveying processor hereinafter. The roller conveying processor is preferably comprises four steps of development, fixing, rinsing and drying. Although these four steps are most preferably adopted in the present invention, another step (such as stopping step) will not be excluded. Also the four steps may employ a stabilizing step instead of the rinsing step.

In each of the above-described steps, components of the developing solution or the fixing solution may be supplied as a solid by eliminating water, and may be dissolved before using in a predetermined amount of water to form a developing solution or a fixing solution. The processing material of such a form is called a solid processing material. The solid processing material is utilized in the form of a powder, a tablet, granules, a block or a paste. A preferred form of the processing material is a form as described in JP-A-61-259921 or a tablet. Such a tablet can be produced by a commonly employed method described in, for example, JP-A-51-61837, JP-A-54-155038, JP-A-52-88025, and BP No. 1,213,808. The solid processing material in the form of granules can be produced by a commonly employed method described in, for example, JP-A-2-109042, JP-A-2-109043, JP-A-3-39735 and JP-A-3-39739. The processing material in the form of a powder can be produced by a commonly employed method described in, for example, JP-A-54-133332, BP Nos. 725,892 and 729,862 and GP No. 3,733,861.

Taking the solubility into consideration, the solid processing material preferably has a bulk density of 0.5 to 6.0 $g/cm^3$, more preferably 1.0 to 5.0 $g/cm^3$.

To prepare the solid processing material, use can be made of a method which comprises providing reactive substances in such a layered manner that at least two mutually reactive granular substances, in the substances constituting the processing material, constitute layers separated by at least an intermediate separating layer of a substance inert to the reactive substances, then employing a bag capable of vacuum packing as a packaging material and evacuating and sealing the bag. The term "inert" as used herein means that the substances in mutual contact do not react in an ordinary state in the package nor cause a significant reaction. The inactive substance may be inert to the two mutually reactive substances or may be inert in the intended use of the two mutually reactive substances. Also the inert substance is a substance to be employed simultaneously with the two reactive substances. For example, in the developing solution, since hydroquinone and sodium hydroxide react in a direct contact, sodium sulfite or the like may be employed as a separating layer between hydroquinone and sodium hydroxide in the vacuum package, thereby enabling a prolonged storage. Also hydroquinone or the like may be formed in briquettes to reduce the contact area with sodium hydroxide, thereby improving storage properties and enabling use as a mixture. As a packaging material for such vacuum package, use can be made of a bag formed from an inert plastic film or a laminate of a plastic material and a metal foil.

A mass of metallic silver contained in an exposed area after the development process is preferably 50% by mass or more, based on the mass of silver contained in the exposed area prior to the exposure, more preferably 80% by mass or more. It is preferable that metallic silver contained in an exposed area in an amount of 50% by mass or more based on the mass of silver contained in such exposed area prior to the exposure, since a high electroconductivity can be obtained in this case.

Although the gradation to be conducted after the development process of the invention is not particularly restricted, it is preferably higher than 4.0. A gradation higher than 4.0 after the development process allows to increase the conductivity in the conductive metal part while maintaining a high transparency in the light transmitting part. A gradation higher than 4.0 can be obtained by, for example, doping with rhodium ions or iridium ions as described above.

(2-3) Physical Development and Plating Process

In order to impart an electroconductivity to a metallic silver part formed by the exposure and the development process, it is preferable in the invention that a physical development and/or a plating process are conducted so as to make the metallic silver part to carry conductive metal grains. In the invention, the conductive metal grains can be carried on the metallic silver part by either of the physical development and the plating process. Moreover, such carrying of the conductive metal grains on the metallic silver part may also be achieved by combining the physical development and the plating process. A metallic silver part, which has been subjected to the physical development and/or the plating process is sometimes called a "conductive metal part".

The term "physical development" as used in the invention means to reduce a metal ion such as a silver ion with a reducing agent to deposit metal grains on a nucleus of a metal or a metal compound. This physical development has been employed in an instant B&W film or an instant slide film or in producing a printing plate, and these techniques can be utilized in the present invention.

The physical development may be conducted either simultaneously with the development process after the exposure, or separately after the development process.

In the invention, a plating process may be an electroless plating (chemical reduction plating or substitution plating) or an electrolytic plating. Alternatively, use can be made of both of the electroless plating and the electrolytic plating.

Next, a preferable embodiment of the electrolytic plating process will be described in detail by referring to the drawing. A plating apparatus for appropriately carrying out the electrolytic plating process as described above has a constitution wherein a film, which has been subjected to the exposure of the emulsion layer and the development process, is successively fed from an unwinding reel (not shown) carrying the film wound therearound into an electrolytic plating tank and, after the completion of the plating, the film is successively wound around a winding reel (not shown).

FIG. 1 shows an example of an electrolytic plating tank appropriately usable in the electrolytic plating process as described above. By this electrolytic plating tank (10) shown in FIG. 1, a long film (16) (the film having been subjected to the exposure and the development process as described above) can be continuously plated. The arrow indicates the transporting direction of the film (16). The electrolytic plating tank (10) is provided with a plating bath (11) in which a plating solution (15) is pooled. In the plating bath (11), a pair of anode plates (13) is provided in parallel. A pair of guide rollers (14) is located medial to the anode plates (13) in such a manner as being rotatable in parallel to the anode plates (13). The guide rollers (14) are perpendicularly movable so that the plating process time of the film (16) can be adjusted thereby.

Above the plating bath (11), a pair of feeding rollers (cathodes) (12a, 12b) is provided each in a rotatable manner. Above the plating bath (11), a draining roller (17) is rotatably provided below the feeding roller (12b) in the outlet side. Between this draining roller (17) and the feeding roller (12b), a water-washing spray (not shown) is provided for removing the plating solution from the film.

The anode plates (13) are connected to the plus end terminal of an electric power supply (not shown) via electric wires (not shown), while the feeding rollers (12a, 12b) are connected to the minus terminal of the electric power supply (not shown).

In the case where the electrolytic plating tank (10) has a size of, for example, 10×10×10 cm to 100×200×300 cm, it is preferable that the distance between the lowermost part of the contact face of the feeding roller (12a) in the inlet side and the film (16) and the plating solution face (the distance La shown in FIG. 1) is adjusted to 0.5 to 15 cm, more preferably 1 to 10 cm and more preferably 1 to 7 cm. It is also preferable that the distance between the lowermost part of the contact face of the feeding roller (12b) in the outlet side and the film (16) and the plating solution face (the distance Lb shown in FIG. 1) is adjusted to 0.5 to 15 cm.

Next, a method of forming a copper plate on the mesh pattern of a film by using a plating apparatus provided with the electrolytic plating tank (10) as described above will be illustrated.

First, the plating solution (15) is pooled in the plating bath (11). As the plating solution, use can be made of a solution containing from 30 to 300 g/L of copper sulfate pentahydrate and from 30 to 300 g/L of sulfuric acid. In the case of nickel plating, use can be made of a solution containing nickel sulfate, nickel hydrochloride or the like. In the case of silver plating, use can be made of a solution containing silver cyanide or the like. The plating solution may further contain an additive such as a surfactant, a sulfur compound or a nitrogen compound.

The film (16) is set in the state of being wound around the unwinding reel (not shown). Then, the film (16) is wound around a transport roller (not shown) so that the face in the side where the plating is to be formed of the film (16) comes into contact with the feeding rollers (12a, 12b). The surface resistivity of the film immediately before the electrolytic plating is preferably from 1 to 1000Ω/, more preferably from 5 to 500Ω/ and more preferably from 10 to 100Ω/ .

A voltage is applied to the anode plates (13) and the feeding rollers (12a, 12b) and the film (16) is transported under being in contact with the feeding rollers (12a, 12b). The film (16) is introduced into the plating bath (11) in which the film is immersed in the plating solution (15) to form copper plating. When the film passes on the draining roller (17), the plating solution sticking to the film (16) is wiped off and recovered into the plating bath (11). This procedure is repeated in a plural number of electrolytic plating tanks. After finally washing with water, the film is wound around the winding reel (not shown).

It is preferable to set the transport speed of the film (16) to 1 to 30 m/min. It is more preferable that the transport speed of the film (16) is from 1 to 10 to 30 m/min, more preferably from 2 to 5 m/min.

Although the number of the electrolytic plating tanks is particularly restricted, it is preferable to employ two to ten tanks, more preferably three to six tanks.

The applied voltage preferably ranges from 1 to 100 V, more preferably from 2 to 60 V. In the case of providing two or more electrolytic plating tanks, it is preferable to lower the voltage applied onto the electrolytic plating tanks stepwise. It is also preferred that the electrical current amount in the inlet side of the first tank is from 1 to 30 A, more preferably from 2 to 10 A.

It is also preferable that the feeding rollers (12a, 12b) are in contact with the entire film face (the ratio of the area substantially being in electrical contact amounting to 80% or more based on the total contact area).

Before conducting the plating process in the electrolytic plating bath as described above, it is preferable to perform water washing and acid washing. As an treatment solution to be employed in the acid washing, use can be made of a solution containing sulfuric acid, etc.

In the case of using as an electromagnetic wave shielding material for a display, the metal plating layer thus formed preferably has an as small thickness as possible for increasing a viewing angle of the display. In the case of using as a conductive wiring material, a thinner film is required for achieving a higher density. From these points of view, the layer made of the conductive metal thus plated preferably has a thickness less than 9 μm, more preferably 0.1 m or more but less than 5 μm and further preferably 0.1 m or more but less than 3 μm.

In the plating process in the present invention, it is also possible to conduct an electroless plating process before the electrolytic plating.

In the case of conducting the electroless plating, use can be made of a publicly known electroless plating technique, e.g., that has been utilized in, for example, a printing wiring board, and is preferably an electroless copper plating.

Examples of the chemical species contained in an electroless copper plating solution include copper sulfate or copper chloride, a reducing agent such as formalin or glyoxylic acid, a copper ligand such as EDTA or triethanolamine, and additives for bath stabilization and for improving smoothness of a plated film such as polyethylene glycol, a ferrocyanate salt or bipyridine.

It is also preferable that the conductive pattern on the film continuous even at a part thereof (not being electrically interrupted). When the conductive pattern is interrupted, there is a risk that some part is not plated in the electrolytic plating bath of the plating becomes uneven.

The plating process can be conducted under mild plating speed conditions or at a high plating speed of 5 μm/hr or higher. In the plating process, use can be made of various additives such as a ligand such as EDTA so as to improve the stability of the plating solution.

(2-4) Oxidation Process

It is preferable in the invention that a metallic silver part after the development process and a conductive metal part formed by the physical development and/or the plating process are subjected to an oxidation process. By conducting the oxidation process, it is possible to eliminate a metal eventually slightly deposited in a light transmitting part, thereby obtaining a transparency of approximately 100% in the light transmitting part.

The oxidation process can be conducted by a known process utilizing various oxidants, such as process with Fe (III) ions. As described above, the oxidation process can be conducted after the exposure and the development process of the emulsion layer or after the physical development or the plating process. It is also possible to conduct the oxidation process after the development process and after the physical development or the plating process.

In the invention, it is furthermore possible to treat the metallic silver part after the exposure and the development process, with a Pd-containing solution. Pd may be a divalent palladium ion or metallic Pd. Owing to this treatment, it is possible to accelerate the electroless plating or the physical development.

(3) Conductive Metal Part

In the case of using as a light transmitting electromagnetic wave shielding material, the conductive metal part in the invention preferably has a geometrical shape formed by a combination of a triangular shape such as an equilateral triangle, an isosceles triangle or a right-angled triangle, a quadrilateral such as a square, a rectangle, a rhombus, a parallelogram or a trapezoid, a regular (n)-polygon such as a regular hexagon or a regular octagon, a circle, an oval or a star-shape, and more preferably a mesh constituted of such geometrical shapes. A triangular shape is most effective from the viewpoint of the EMI shielding property, but, in consideration of the visible light transmittance, a regular (n)-polygon with a larger number n is advantageous as it provides a larger aperture rate for a same line width thereby increasing the visible light transmittance. To minimize moire, it is also preferable to provide these geometrical shapes at random or non-periodically alter the line width.

In the case of using as a conductive wiring material, the conductive metal part is not particularly restricted in the shape, and can be selected in an arbitrary shape according to the purpose.

In the case of using as a light transmitting electromagnetic wave shielding material, the thin lines in the conductive metal part should be regulated to 1 μm or more but not more than 40 μm, preferably 5 μm or more but not more than 30 μm and most preferably 10 μm or more but not more than 25 μm. The line intervals is preferably 50 μm or more but not more than 500 μm, more preferably 200 μm or more but not more than 400 μm and most preferably 250 μm or more but not more than 350 μm. For the purpose of grounding or the like, the conductive metal part may have a section having a line width exceeding 20 μm.

The conductive metal part in the invention preferably has an aperture rate of 85% or higher in consideration of the visible light transmittance, more preferably 90% or higher and most preferably 95% or higher. The term "aperture rate" as used herein means a ratio of a part outside the fine line constituting the mesh in the entire area, and, for example, a square lattice mesh of a line width of 15 μm and a pitch of 300 μm has an aperture rate of 90%.

(4) Light Transmitting Part

The term "light transmitting part" as used herein means a part having transparency, other than the conductive metal part in the light transmitting electromagnetic wave shielding film. As discussed above, "transmittance of the light transmitting part" means a part having a transmittance indicated by the minimum transmittance within a wavelength region of 380 to 780 nm, excluding contributions of an absorption and a reflection of the support, of 90% or higher, more preferably 95% or higher, further preferably 97% or higher and most preferably 99% or higher.

The mesh pattern of the conductive metal part in the invention preferably continues for 3 m or longer. A mode having a larger repetition number is preferred, since a loss in producing the optical filter material can be thus reduced. On the other hand, an increase in the repetition frequently causes such problems as the roll diameter being increased in winding into a roll, the roll becoming heavier, and the pressure at the roll center being elevated to cause troubles including adhesion and deformation. Thus, it is preferable that the length of the mesh pattern is not longer than 2000 m, preferably 100 m or longer but not longer than 1000 m, more preferably 200 m or longer but not longer than 800 m and most preferably 300 m or longer but not longer than 500 m.

For the same reasons, the thickness of the support is preferably 200 μm or less, more preferably 20 μm or more but not more than 180 μm and most preferably 50 μm or more but not more than 120 μm.

The expression "a pattern made up of straight thin lines, which are being arranged substantially in parallel, intersecting with each other" as used herein means a so-called lattice pattern wherein thin lines adjacent to each other, which constitute the lattice pattern, are in parallel or aligned at an angle within ±2° to being parallel.

It is preferable in the invention to incline the mesh pattern at an angle of 30° to 60° to the transport direction, more preferably 40° to 50° and most preferably 43° to 47°. This is because a mask having an inclination of the mesh pattern at about 45° to a frame can be hardly manufactured in general and is accompanied by some problems including occurrence of unevenness and an elevation in the cost. In the above-described method, on the other hand, unevenness is rather relieved at around 45° and, therefore, the advantages of the present invention become noticeable compared with photolithography of the mask aligner exposure system or patterning by screen printing.

[Functional Layers of Light Transmitting Electromagnetic Wave Shielding Film]

(1) Infrared Ray Shielding Layer

The light transmitting electromagnetic wave shielding film according to the invention has infrared ray shielding properties (in particular, near infrared ray shielding properties). Since a plasma display generates strong near infrared rays as mentioned above, the optical filter should cut not only electromagnetic wave but also near infrared rays to such an extent as causing no problem in practice. Thus, it is necessary to regulate the transmittance in the wavelength region of from 800 to 1000 nm to 25% or less, preferably 15% or less and more preferably 10% or less.

As specific embodiment modes, there can be enumerated: (1) containing an infrared ray absorbing dye in the support; and (2) containing an infrared ray absorbing dye in a layer formed on the support.

The embodiment mode (1) is preferable because the durability of the infrared ray absorbing dye can be improved and the number of steps in producing the light transmitting electromagnetic wave shielding film can be reduced thereby. In the embodiment mode (1), the light transmitting electromagnetic wave shielding film can be produced by adding an infrared ray absorbing dye or a metal complex compound capable of absorbing infrared rays as will be described hereinafter to the support as described above. More specifically speaking, there can be enumerated: (I) a method which comprises kneading a resin for the support with an infrared ray absorbing dye and then forming the support by heat molding; and (II) a method which comprises cast-polymerizing an infrared ray absorbing dye together with a rein monomer or a prepolymer of a resin monomer in the presence of a polymerization catalyst to form the support.

In the embodiment mode (2), a light transmitting electromagnetic wave shielding film can be produced by coating a coating composition, which contains an infrared ray absorbing dye or a metal complex compound capable of absorbing infrared rays as will be described hereinafter, a solvent, a transparent resin, etc., to the support. In this case, the coating may be carried out simultaneously with the coating step of the emulsion layer as described above or thereafter. By carrying out the coating simultaneously with the coating step of the emulsion layer as described above or thereafter, the light transmitting electromagnetic wave shielding film can be formed at a high efficiency, thereby improving the productivity. It is also possible to form a layer having infrared ray shielding properties (being called an infrared ray shielding layer, an infrared ray blocking layer or an infrared ray absorbing layer) by the sputtering method.

The coating method for forming the infrared ray shielding layer may be selected from among the dip coating method, the roll coating method, the spray coating method, the gravure coating method, the die coating method and so on. Such a coating method is usable in continuous processing and, therefore, superior in productivity to, for example, the batch-type deposition method. Alternatively, use can be made of the spin coating method by which a thin and even coating film can be formed.

In the embodiment mode (2), the layer containing the infrared ray absorbing dye (the infrared ray blocking layer) may be formed across the support either in the same side as the metallic silver part or the opposite side thereto. It is also preferable to add an infrared ray absorbing dye, etc. to a composition for an adhesive layer as will be described hereinafter to thereby impart the infrared ray shielding properties to the adhesive layer.

Furthermore, two or more infrared ray blocking layers may be formed. In this case, two or more of the infrared ray blocking layers can be formed in accordance with the method described in paragraphs [0039] to [0049] in JP-A-2001-14206.

To attain an effective near infrared ray shielding effect, it is preferable that the thickness of the infrared ray shielding layer is 0.5 μm or more. From the viewpoints of easiness in removing the residual solvent in the film-forming step and easiness in performing the film-forming procedure, it is preferable that the thickness is 20 μm or less. It is particularly preferable that the thickness ranges from 1 to 10 μm.

(Infrared Ray Absorbing Dye)

As the infrared ray absorbing dye, use can be made of a diimonium compound. Examples of the diimonium compound include compounds represented by the general formula (2) described in JP-B-43-25335. As specific examples of the compounds represented by the general formula (2), N,N,N',N'-tetrakis(p-diethylaminophenyl)-p-benzoquinone-bis(imonium) salts, etc. can be cited. Such a compound can be optionally synthesized and employed. Alternatively, use can be made of a marketed compound. The diimonium compound has a strong absorbance of a molar absorptivity of about 100,000 in the near infrared region of 900 to 1100 nm in wavelength. Although it has a yellowish brown to green transmission color because of showing somewhat absorption in the visible light region of 400 to 500 nm in wavelength, it is superior in the visible light transmittance to other near infrared ray absorbing dyes.

As the diimonium compound, use can be also made of the compound represented by the formula (3) as disclosed by JP-A-2003-75628.

Although the content of the diimonium compound depends on the thickness of the infrared ray shielding layer, the near infrared ray (wavelength: 900 to 1000 nm) transmittance thereof should be regulated to 20% or less in order to achieve practically usable infrared ray shielding properties. In the case of setting the thickness of the infrared ray shielding layer to about 1 to about 20 μm, therefore, it is preferable, from the viewpoints of the segregation of the compound in the infrared ray shielding layer and the visible light transparency, to control the total content of the compound to about 0.05 to about 5.0 parts by mass per 100 parts by mass of the transparent resin.

To impart a practically available durability to the infrared ray shielding layer, it is preferable to use a diimonium compound as described above having a melting point of 190° C. or higher. A compound having a melting point lower than 190° C. is liable to denatured at a high temperature and high humidity. By using a compound having a melting point of 190° C. or higher and selecting an appropriate resin species as will be discussed hereinafter, a practically available durability can be established.

To control the near infrared ray (wavelength: 800 to 900 nm) transmittance to 20% or below so as to achieve practically usable near infrared ray absorbing properties, it is preferable to employ one or more near infrared ray absorbing dyes, each having the maximum absorption at 750 to 900 nm and substantially no absorption in the visible light region, for example, the ratios of the coefficient of absorption at the maximum absorption wavelength to the absorption coefficients at 450 nm (the central wavelength of blue color), at 550 nm (the central wavelength of green color) and at 620 nm (the central wavelength of red color) being each 8.0 or above, as the secondary near infrared ray absorbing dye to be added to the near infrared ray absorbing resin composition.

It is not preferable that any one of the absorption coefficient ratios is 8.0 or less. This is because, in such a case, any one of the visible light transmittances at 450 nm (the central wavelength of blue color), at 550 nm (the central wavelength of green color) and at 620 nm (the central wavelength of red color) becomes 65% or less, referring the near infrared ray transmittance at 800 to 900 nm required in practice as to 20% or less and this decrease in the visible light transmittance causes coloration of the light transmitting through the near infrared ray absorbing layer. On the other hand, it is preferable that each of the absorption coefficient ratios is 8.0 or more since such a problem never arises. In this case, moreover, a visible light transmittance of 68% or more, which is appropriate as a near infrared shielding laminate also having an antireflective film layer as will be described hereinafter, can be established.

As examples of the near infrared ray absorbing dye which has the maximum absorption at 750 to 900 nm and in which the ratios of the coefficient of absorption at the maximum absorption wavelength to the absorption coefficients at 450 nm (the central wavelength of blue color), at 550 nm (the central wavelength of green color) and at 620 nm (the central wavelength of red color) are each 8.0 or above, there can be enumerated a dithiol nickel complex compound, an indolium compound, a phthalocyanine compound and a naphthalocyanine compound. Among all, a phthalocyanine compound and a naphthalocyanine compound can be appropriately employed because of generally having an excellent durability. However, the former is preferably employed since the latter is more expensive.

In recent years, there have been proposed a number of phthalocyanine compounds having the maximum absorption in the near infrared region which are obtained by introducing a conjugated π electron system substituent such as a phenyl group into the phthalocyanine skeleton or introducing a number of electron-donating substituents such as an alkoxy group thereinto. Among all, use can be appropriately made of the phthalocyanine compounds represented by the general formula (3) described in JP-A-2002-138203, since its ratios of the coefficient of absorptions as described above are each 8.0 or above.

It is also possible to use an anthraquinone compound. As the anthraquinone compound, use can be made of the compound represented by the formula (1) or (2) described in JP-A-2003-75628.

Moreover, a phthalocyanine compound or a naphthalocyanine can be used as the infrared ray absorbing dye. Among all, it is preferable to use a phthalocyanine compound represented by the general formula (1) described in JP-A-2003-222721 or a naphthalocyanine represented by the general formula (2) described in the same document.

In addition to the dyes as described above, there can be enumerated a polymethine compound, a metal complex compound, an aminium compound, an imonium compound, a diimonium compound, an anthraquinone compound, a dithiol metal complex compound, a naphthoquinone compound, an indole phenol compound, an azo compound, a triallyl-methane compound and water-soluble dyes such as an indolenine cyanine and an oxole barbiturate dye, though the invention is not restricted thereto. In the case of using for absorbing heat rays or preventing noises in an electronic device, it is preferable to use a near infrared ray absorbing dye having a maximum absorption wavelength of from 750 to 1100 nm. Thus, use can be preferably made of a metal complex dye, an aminium dye, a phthalocyanine dye, a naphthalocyanine dye or a diimonium dye.

A water soluble dye such as an indolenine cyanine or an oxole barbiturate dye can be coated in the form of an aqueous solution without dissolving in an organic solvent, which is favorable from the viewpoints of reducing environmental impact and lowering coating cost.

To effectively establish the infrared ray shielding effect, it is preferable to use the infrared ray absorbing dye in an amount of 0.1% by mass or more, based on the transparent resin, more preferably 2% by mass or more. To sustain the physical properties of the transparent resin, it is also preferable to regulate the content of the infrared ray absorbing dye not to exceed 10% by mass.

(Metal Complex Compound)

As the metal complex compound, use can be made of the metal complex compounds represented by the general formula (1) or the general formula (2) as described in JP-A-2003-262719.

Although the concentration of the metal complex compound varies depending on the thickness of the infrared ray blocking layer, the desired absorption intensity, the desired visible light transmittance and so on, it usually ranges from 0.1 to 30% based on the mass of the transparent resin.

(Other Dyes)

It is also possible to add one or more kinds of color collection dyes having the maximum absorption wavelength falling within the range of 300 to 800 nm. As examples of the color correction dyes, there can be enumerated commonly employed ones such as an inorganic pigment, an organic pigment and an organic dye.

As the organic dye, use can be made of a ketone or an ester in which the resin as will be described hereinafter is soluble, or a fat-soluble dye or an organic solvent-soluble dye which is soluble in an aromatic solvent. As the organic pigment, it is possible to use an azo pigment, a phthalocyanine pigment, a quinacridone pigment, a dioxadine pigment and so on.

Examples of the inorganic pigment include a cobalt dye, an iron dye, a chromium dye, a titanium dye, a vanadium dye, a zirconium dye, a molybdenum dye, a ruthenium dye, a platinum dye, an ITO dye, an ATO dye and so on. Examples of the organic pigment and the organic dye include an aluminum dye, a cyanine dye, a mellocyanine dye, a croconium pigment, a squarium dye, an azlenium dye, a polymethine dye, a naphthoquinone dye, a pyrrilium dye, a phthalocyanine dye, a naphthalocyanine dye, a naphtolactam dye, an azo dye, a condensed azo dye, an indigo dye, a perinone dye, a perylene dye, a dioxadine dye, a quinacridone dye, an isoindolinone dye, a quinophthalone dye, a pyrrole dye, a thioindigo dye, a metal complex dye, a dithiol metal complex dye, an indole phenol dye, a triallyl methane dye and so on. Among these dyes, a metal complex dye, an aminium dye, a phthalocyanine dye, a naphthalocyanine dye, a pyrrole dye etc. are preferred.

It is preferable that the amount of the color correction dye is controlled within a range of from 0.1 to 10.0% by mass based on the total amount of the solid matters in the transparent resin and the all dyes. By using 0.1% by mass or more of the color correction dye, a sufficient ability to correct the color can be established. By regulating the amount thereof not to exceed 10.0% by mass, the interactions among dyes can be controlled and a favorable dye stability can be achieved. From these view points, it is particularly preferable to control the amount thereof to 1.0 to 9.0% by mass.

(Transparent Resin)

It is preferable that the composition for infrared ray blocking layer contains a transparent resin for forming a coating film. Specific examples of the transparent resin include polyethylene, polystyrene, polyacrylic acid, polyacrylic ester, vinyl compounds such as polyvinyl acetate, polyacrylonitrile, polyvinyl chloride and polyvinyl fluoride, addition polymers of these vinyl compounds, polymethacrylic acid, polymethacrylic ester, polyvinylidene chloride, polyvinylidene fluoride, polyvinylidene cyanide, copolymers of a vinyl compound or a fluorine compound such as vinylidene fluoride/trifluoroethylene copolymer, vinylidene fluoride/tetrafluoroethylene copolymer and vinylidene cyanide/vinyl acetate copolymer, fluorinated resins such as polytrifluoroethylene, polytetrafluoroethylene and polyhexafluoropropylene, polyamides such as nylon 6 and nylon 66, polyimide, polyurethane, polypeptide, polyesters such as polyethylene terephthalate, polyethers such as polycarbonate, polyoxymethylene, polyethylene oxide and polypropylene oxide, an epoxy resin, polyvinyl alcohol, polyvinyl butyral and so on. However, the present invention is not restricted thereto and it is also preferable to use a resin having such a high hardness and high transparency as being usable as a substitute for glass, a thermosetting resin such as a thiourethane resin, an optical resin such as ARTON™ (manufactured by JSR Co.), ZEONEX™ (manufactured by ZEON Co.), OPTOREZ™ (manufactured by HITACHI CHEMICAL Co., Ltd.) or O-PET™ (manufactured by KANEBO).

Among the resins as cited above, it is desirable that the transparent resin is either an acrylic resin or a methacrylic resin having a glass transition temperature of 70° C. or higher. When the glass transition temperature of the transparent resin is lower than 70° C., the resin is softened when exposed to a high temperature of 70° C. or higher for a long time and, at the same time, a diimonium compound in the near infrared ray shielding layer is liable to be denatured. As a result, the long-term stability thereof is undesirably affected, i.e., the color balance is damaged or the near infrared ray shielding properties are worsened. When the glass transition temperature thereof is 70° C. or higher, on the other hand, the thermal denaturation of the near infrared ray absorbing dye comprising a dye, in particular, a diimonium compound can be prevented. As a resin satisfying these requirements, there can be enumerated a polyester-based resin, an acrylic resin, a methacrylic resin and so on. Taking the dyeing property of a diimonium compound which is a basic dye into consideration, use may be appropriately made of an acrylic resin or a methacrylic resin.

In the case where a resin monomer or a prepolymer of a resin monomer is polymerized in the presence of a polymerization catalyst, a number of resins can be molded during this process. For example, use can be made of a resin monomer of an acrylic resin, a diethylene glycol bis(allylcarbonate) resin, an epoxy resin, a phenol-formaldehyde resin, a polystyrene resin, polysulfide or a silicone resin. Among all, block polymerization of methyl methacrylate is preferable, since an acryl sheet being excellent in hardness, heat resistance and chemical resistance can be obtained thereby. As the polymerization catalyst, use can be made of a radical heat polymerization initiator, for example, a commonly known one, e.g., a peroxide such as benzoyl peroxide, p-chlorobenzoyl peroxide, diisopropyl peroxycarbonate, di-2-ethylhexyl peroxycarbonate, t-butyl peroxypivalate or t-butyl peroxy(2-ethylhexanoate) or an azo compound such as azobisisobutyronitrile. The polymerization catalyst is employed usually in an amount of from 0.01 to 5% by mass based on the total amount of the mixture. In the heat polymerization, the heating temperature is usually from 40 to 200° C. and the heating time is usually from about 3 minutes to about 8 hours. In addition to the heat polymerization, it is also possible to use the photopolymerization method with the use of a photopolymerization initiator or a sensitizer.

[Sovent]

The composition for infrared ray shielding layer can be obtained by dissolving or dispersing the infrared ray absorbing dye, the transparent resin and so on as described above in a solvent, in which these components can be dissolved or dispersed, by a publicly known method. Examples of the solvent include methyl ethyl ketone, methyl isobutyl ketone, cyclohexanone, acetone, acetonitrile, dichloromethane, dimethylformamide, butyl acetate, toluene and so on. Either one of them or a mixture thereof can be appropriately used.

In the case where a water-soluble dye such as an indolenine cyanine or an oxole barbiturate dye is coated in the form of an aqueous solution without dissolving in an organic solvent, it is possible to apply an aqueous solution containing such a water soluble dye together with a water soluble polymer such as gelatin or polyvinyl alcohol.

(2) Adhesive Layer

In the case of integrating into an optical filter, a liquid crystal display panel, a plasma display panel, another image display Glat panel, an image-picking semiconductor integrated circuit typified by a CCD or the like, it is preferable that the electromagnetic wave shielding film according to the invention is bonded via an adhesive layer.

In the invention, it is preferable to employ an adhesive having a refractive index of from 1.40 to 1.70. This is because a lowering in the visible light transmittance can be prevented by minimizing the difference in refractive index between the adhesive and a transparent base material such as a plastic film to be used in the invention. So long as the refractive index falls within the range of 1.40 to 1.70, the visible light transmittance is scarcely lowered and favorable results can be obtained.

It is preferable to use an adhesive that becomes flowable by heating or pressurizing. An adhesive showing flowability when heated to 200° C. or lower or pressurizing at 1 kgf/cm$^2$ or more is particularly preferred. By using such an adhesive, it is possible to make the adhesive layer flowable to thereby bond the film having light transmitting electromagnetic wave shielding properties to an adherend such as a display or a plastic plate. Because of being flowable, the adhesive layer makes it possible to easily bond the film having light transmitting electromagnetic wave shielding properties to an adherend by laminating, pressure molding, in particular, pressure molding even to an adherend having a curved face or a complicated shape. For this purpose, it is preferable that the softening point of the adhesive is 200° C. or lower. Since the film having light transmitting electromagnetic wave shielding properties is usually employed at a temperature lower than 80° C. for the purposes of using, it is preferable that the softening point of the adhesive is 80° C. or higher, most preferably from 80 to 120° C. by taking the processability into consideration. The term "softening point" means a temperature at which the viscosity becomes $10^{12}$ P or lower. At such a temperature, the viscosity of a substance is lowered to $10^{12}$ P ($10^{13}$ Pa·s) or less. At this temperature, the substance usually becomes flowable within about 1 to about 10 seconds.

Typical examples of the adhesive which becomes flowable by heating or pressurizing as described above include thermoplastic resins as will be cited below. That is, use can be made therefor of natural rubber (refractive index n=1.52), polyisoprene (n=1.521), poly-1,2-butadiene (n=1.50), polyisobutene (n=1.505 to 1.51), polybutene (n=1.513), dienes such as poly-2-heptyl-1,3-butadiene (n=1.50), poly-2-t-butyl-1,3-butadiene (n=1.506) and poly-1,3-butadiene (n=1.515), polyoxyethylene (n=1.456), polyoxypropylene (n=1.450), polyethers such as polyvinyl ethyl ether (n=1.454), polyvinyl hexyl ether (n=1.459) and polyvinyl butyl ether (n=1.456), polyesters such as polyvinyl acetate (n=1.467) and polyvinyl propionate (n=1.467), polyurethane (n=1.5 to 1.6), ethyl cellulose (n=1.479), polyvinyl chloride (n=1.54 to 1.55), polyacrylonitrile (n=1.52), polymethacrylonitrile (n=1.52), polysulfone (n=1.633), polysulfide (n=1.6), a phenoxy resin (n=1.5 to 1.6), and poly(meth)acrylic esters such as polyethyl acrylate (n=1.469), polybutyl acrylate (n=1.466), poly-2-ethylhexyl acrylate (n=1.463), poly-t-butyl acrylate (n=1.464), poly-3-ethoxypropyl acrylate (n=1.465), polyoxycarbonyl tetramethylene (n=1.465), polymethyl acrylate (n=1.472 to 1.480), polyisopropyl methacrylate (n=1.473), polydodecyl methacrylate (n=1.474), polytetradecyl methacrylate (n=1.475), poly-n-propyl methacrylate (n=1.484), poly-3,3,5-trimethylcyclohexyl methacrylate (n=1.484), polyethyl methacrylate (n=1.485), poly-2-nitro-2-methylpropyl methacrylate (n=1.487), poly-1,1-diethylpropyl methacrylate (n=1.489) and polymethyl methacrylate (n=1.489). If necessary, two or more kinds of these acryl polymers may be copolymerized. It is also possible to use a blend of two or more kinds thereof.

As a resin obtained by copolymerizing an acrylic resin with a resin other than acrylic resins, use can be also made of an epoxy acrylate (n=1.48 to 1.60), a urethane acrylate (n=1.5 to 1.6), a polyether acrylate (n=1.48 to 1.49), a polyester acrylate (n=1.48 to 1.54) and so on. From the viewpoint of adhesiveness, a urethane acrylate, an epoxy acrylate and a polyether acrylate are excellent. Examples of the epoxy acrylate include (meth)acrylic acid adducts of 1,6-hexanediol diglycidyl ether, neopentyl glycol diglycidyl ether, allyl alcohol diglycidyl ether, resorcinol diglycidyl ether, diglycidyl adipate, diglycidyl phthalate, polyethylene glycol diglycidyl ether, trimethylolpropane triglycidyl ether, glycerol triglycidyl ether, pentaerythritol tetraglycidyl ether, sorbitol tetraglycidyl ether and so on. A polymer having a hydroxyl group in its molecule such as an epoxy acrylate is effective in improving adhesiveness. If necessary, two or more kinds of these copolymer resins may be used together. From the viewpoint of handling properties, the softening point of such a polymer to be used an adhesive is appropriately 200° C. or lower and preferably 150° C. or lower. Since the electromagnetic wave shielding adhesive film is usually employed at a temperature lower than 80° C. for the purposes of using, it is most preferable that the softening point of the adhesive is 80 to 120° C. by taking the processability into consideration. On the other hand, it is preferable to use a polymer having a weight-average molecular weight (a value measured by using a calibration curve obtained by gel permeation chromatography using polystyrene as a standard; the same will apply hereinafter) of 500 or more. A polymer having a molecular weight less than 500 can impart only an insufficient cohesive force to an adhesive composition, which results in a fear of lowering the adhesiveness to an adherend. The adhesive to be used in the invention may contain, if necessary, an additive such as a diluent, a plasticizer, an antioxidant, a filler, a coloring agent, a ultraviolet absorber or a tackifier. The thickness of the adhesive layer is preferably about 5 to about 50 μm, particularly preferably about 1 to about 20 μm.

It is preferable that the difference in refractive index between an adhesive coating a geometric pattern and a transparent plastic substrate is regulated to 0.14 or less. In the case where the transparent plastic substrate is layered on a conductive material via the adhesive layer, the difference in refractive index between the adhesive layer and the adhesive coating a geometric pattern is regulated to 0.14 or less. This is because, when the refractive indexes of the transparent plastic substrate and the adhesive layer, or the refractive indexes of the adhesive and the adhesive layer largely differ, the visible light transmittance is lowered. So long as the difference in refractive index is 0.14 or less, the visible light transmittance is scarcely lowered and thus favorable results can be obtained. In the case of using polyethylene terephthalate (refractive index n=11.575) as the transparent plastic substrate, use can be made, as the adhesive material fulfilling the above requirement, of epoxy resins (refractive indexes: 1.55 to 1.60) such as a bisphenol A type epoxy resin, a bisphenol F type epoxy resin, a tetrahydroxyphenylmethane type epoxy resin, a novolak type epoxy resin, a resorcin type epoxy resin, a polyalcohol polyglycol type epoxy resin, a polyolefin type epoxy resin, an alicyclic or halogenated bisphenol and so on. Examples thereof other than the epoxy resins include natural rubber (n=1.52), polyisoprene (n=1.521), poly-1,2-butadiene (n=1.50), polyisobutene (n=1.505 to 1.51), polybutene (n=1.5125), dienes such as poly-2-heptyl-1,3-butadiene (n=1.50), poly-2-t-butyl-1,3-butadiene (n=1.506) and poly-1,3-butadiene (n=1.515), polyoxyethylene (n=1.4563), polyoxypropylene (n=1.495), polyethers such as polyvinyl ethyl ether (n=1.454), polyvinyl hexyl ether (n=1.4591) and polyvinyl butyl ether (n=1.4563), polyesters such as polyvinyl acetate (n=1.4665) and polyvinyl propionate (n=1.4665), polyurethane (n=1.5 to 1.6), ethyl cellulose (n=1.479), polyvinyl chloride (n=1.54 to 1.55), polyacrylonitrile (n=1.52), polymethacrylonitrile (n=1.52), polysulfone (n=1.633), polysulfide (n=1.6), a phenoxy resin (n=1.5 to 1.6) and so on. These materials can exert an appropriate visible light transmittance.

In the case of using an acrylic resin as the transparent plastic substrate, use can be made of, in addition to the resins as cited above, poly(meth)acrylic esters such as polyethyl acrylate (n=1.4685), polybutyl acrylate (n=1.466), poly-2-ethylhexyl acrylate (n=1.463), poly-t-butyl acrylate (n=1.4638), poly-3-ethoxypropyl acrylate (n=1.465), polyoxycarbonyl tetramethacrylate (n=1.465), polymethyl acrylate (n=1.472 to 1.480), polyisopropyl methacrylate (n=1.4728), polydodecyl methacrylate (n=1.474), polytetradecyl methacrylate (n=1.4746), poly-n-propyl methacrylate (n=1.484), poly-3,3,5-trimethylcyclohexyl methacrylate (n=1.484), polyethyl methacrylate (n=1.485), poly-2-nitro-2-methylpropyl methacrylate (n=1.4868), polytetracarbanyl methacrylate (n=1.4889), poly-1,1-diethylpropyl methacrylate (n=1.4889) and polymethyl methacrylate (n=1.489). If necessary, two or more kinds of these acryl polymers may be copolymerized. It is also possible to use a blend of two or more kinds thereof.

As a resin obtained by copolymerizing an acrylic resin with a resin other than acrylic resins, use can be also made of an epoxy acrylate, a urethane acrylate, a polyether acrylate, a polyester acrylate and so on. From the viewpoint of adhesiveness, an epoxy acrylate and a polyether acrylate are excellent. Examples of the epoxy acrylate include (meth)acrylic acid adducts of 1,6-hexanediol diglycidyl ether, neopentyl glycol diglycidyl ether, allyl alcohol diglycidyl ether, resorcinol diglycidyl ether, diglycidyl adipate, diglycidyl phthalate, polyethylene glycol diglycidyl ether, trimethylolpropane triglycidyl ether, glycerol triglycidyl ether, pentaerythritol tetraglycidyl ether, sorbitol tetraglycidyl ether and so on. Because of having a hydroxyl group in its molecule, an epoxy acrylate is effective in improving adhesiveness. If necessary, two or more kinds of these copolymer resins may be used together. As the main component of the adhesive, use is made of a polymer having a weight-average molecular weight of 1,000 or more. When the molecular weight is less than 1,000, the adhesive has only an insufficient cohesive power and thus the adhesiveness thereof to an adherend is lowered.

As the hardening agent of the adhesive, use can be made of amines such as triethylene tetramine, xylene diamine and diaminodiphenyl methane, acid anhydrides such as phthalic anhydride, maleic anhydride, dodecylsuccinic anhydride, pyromellitic anhydride and benzophenonetetracarboxylic anhydride, diamino diphenyl sulfone, tris(dimethylaminomethyl)phenol, a polyamide resin, dicyanediamide, ethyl methyl imidazole and so on. Either one of these hardening agents or a mixture of two or more kinds thereof may be used. The amount of such a crosslinking agent may be determined within a range of from 0.1 to 50 parts by mass, preferably form 1 to 30 parts by mass, per 100 parts by mass of the polymer as described above. When the hardening agent is added in an amount less than 0.1 part by mass, only insufficient hardening can be achieved. When the amount thereof exceeds 50 parts by mass, on the other hand, there arises an excessive crosslinking, which sometimes adversely affects the adhesiveness. The resin composition to be used as an adhesive in the invention may contain, if necessary, an additive such as a diluent, a plasticizer, an antioxidant, a filler or a tackifier. This resin composition serving as an adhesive is applied so as to entirely or partly coat the constituting substrate having a geometric pattern drawn with the conductive material on the surface of the transparent plastic substrate. After evaporating off the solvent and hardening by heating, an adhesive film according to the invention is obtained. The thus obtained adhesive film, which has both of electromagnetic wave shielding properties and transparency, is utilized by directly bonding, owing to the adhesive contained in the adhesive film, to a CRT, PDP, liquid crystal or EL display. Alternatively, it is bonded to a plate or a sheet such as an acrylic resin plate or a glass plate and then employed in a display. It is also possible to use this adhesion film in an aperture for observing the interior or a housing of a measurement device, a measurement instrument or a production device generating electromagnetic wave in the same manner as described above. Moreover, it may be utilized in a window of a building with a risk of electromagnetic interference by an electrical wave tower or a high-voltage cable, an automotive window and so on. It is preferable that the geometric pattern drawn with the conductive material is provided with an earth lead.

A part of the transparent plastic substrate surface, from which the conductive material has been removed, has intentionally formed peaks and valleys or the back face pattern of the conductive material has been transferred thereto. Thus, light scattering on the surface causes a decrease in the transparency. This problem can be overcome by smoothly coating the face having the peaks and valleys with a resin having a refractive index closely similar to the transparent plastic substrate to thereby minimize irregular reflection and exhibit transparency. Because of having an extremely small line width, the geometric pattern drawn with the conductive material on the transparent plastic substrate is invisible to the naked eye. Moreover, the pitch is sufficiently large, which seemingly contributes to the exhibition of the apparent transparency. On the other hand, the pitch of the geometric pattern is sufficiently smaller than the wavelength of the electromagnetic wave to be blocked, which seemingly contributes to the exhibition of the transparency.

In the case where a transparent plastic substrate, which is made of a film of an ethylene-vinyl acetate copolymer resin having a high heat fusibility or a highly heat fusible resin such as an ionomer resin, either singly or as a laminate with another resin, is to be laminated on a metal foil, the lamination can be conducted without forming an adhesive layer, as pointed out by JP-A-2003-188576. However, it has been a common practice to carry out the lamination by the dry laminate method with the use of an adhesive layer, etc. Examples of the adhesive constituting the adhesive layer include adhesives comprising an acrylic resin, a polyester resin, a polyurethane resin, a polyvinyl alcohol resin, a vinyl chloride/vinyl acetate copolymer resin, an ethylene/vinyl acetate copolymer resin and so on. Furthermore, use can be made of a thermosetting resin or an ionizing radiation-hardening resin (a ultraviolet hardening resin, an electron beam-hardening resin or the like).

Since a display generally has a glass surface, a transparent plastic film is to be bonded to the glass plate by using a pressure-sensitive adhesive. Accordingly, there arise various problems such as foaming on the adhesion face or occurrence of peeling, and, in its turn, deformation in an image or a color change from the inherent color to be displayed. The foaming and peeling problems are both caused by the peeling of the pressure-sensitive adhesive from the plastic film or the glass plate. This phenomenon possibly occurs in both of the plastic film side and the glass plate side. Namely, it occurs in the side having the smaller adhesion force. Therefore, the pressure-sensitive adhesive should have large adhesion force to both of the plastic film and the glass plate at a high temperature. More specifically speaking, it is preferable that the pressure-sensitive adhesive has an adhesion force to both of the plastic film and the glass plate of 10 g/cm or more at 80° C., more preferably 30 g/cm or more. However, it is sometimes undesirable to use a pressure-sensitive adhesive having an adhesion force exceeding 2000 g/cm, since the bonding procedure becomes troublesome in this case, though such a pressure-sensitive adhesive can be used without any problem in the case being free from the troubles as described above. It is also possible to provide a part of the pressure-sensitive adhesive, which is not facing to the transparent plastic film, with a paper sheet (a separator) so as to prevent unnecessary contact with other parts.

It is preferable to use a transparent pressure-sensitive adhesive. More specifically speaking, the total light transmittance of the pressure-sensitive adhesive is preferably 70% or higher, more preferably 80% or higher and most preferably from 85 to 92%. It is also preferable that the pressure-sensitive adhesive has a low haze. More specifically speaking, the haze of the pressure-sensitive adhesive is preferably 0 to 3%, more preferably 0 to 1.5%. To prevent a color change from the inherent color to be displayed, it is preferable that the pressure-sensitive adhesive to be used in the invention is colorless. However, a pressure-sensitive adhesive having a small thickness can be substantially regarded as colorless, though the resin per se is colored. Also, the case of intentionally coloring as will be discussed hereinafter is excluded therefrom.

Examples of the pressure-sensitive adhesive having the characteristics as described above include an acryl-based resin, an α-olefin resin, a vinyl acetate-based resin, an acrylic copolymer-based resin, a urethane-based resin, an epoxy-based resin, a vinylidene chloride-based resin, an ethylene-vinyl acetate-based resin, a polyamide-based resin, a polyester-based resin and so on. Among them, an acryl-based resin is preferred. Even in the case of using a single resin, the pressure-sensitive adhesiveness can be improved by, for example, lowering the content of a crosslinking agent to be added in synthesizing the pressure-sensitive adhesive by the polymerization method, adding a tackifying component, or modifying a terminal group of the molecule. Even in the case of using a single pressure-sensitive adhesive, furthermore, the adhesiveness can be improved by, for example, surface-modifying the transparent plastic film or the glass plate in the face to be bonded to the pressure-sensitive adhesive. Examples of the surface-modifying method include physical procedures such as corona discharge and plasma glow processing and the formation of an undercoat layer aiming at improving the adhesiveness.

From the viewpoints of transparency, colorlessness and handling properties, it is preferable that the thickness of the pressure-sensitive adhesive layer is from about 5 to about 50 μm. In the case of forming the pressure-sensitive adhesive layer by using an adhesive, the thickness may be lessened within the range as defined above, more specifically, from about 1 to about 20 μm. In the case of causing no change in the display color per se and achieving a transparency falling within the range as defined above, however, the thickness of the layer may exceed the upper limit as defined above.

(3) Antistatic Agent Containing Inorganic Oxide

It is preferable that the layer containing the infrared ray absorbing dye or a layer being in contact therewith contains an antistatic agent containing an inorganic oxide. This is because unintentional formation of a metallic silver part, which is obtained by the development process, caused by static can be prevented thereby.

As the inorganic oxide, a conductive metal oxide is preferred.

As conductive metal oxide grains, needle-shaped grains are preferable. It is preferable to use needle grains having a ratio of the major axis to the minor axis (major axis/minor axis) of from 3 to 50, particularly preferably form 10 to 50. It is preferable that the minor axis of these needle-shaped grains falls within the range of 0.001 to 0.1 µm, in particular, from 0.01 to 0.02 µm. It is also preferable that the major axis thereof falls within the range of 0.1 to 5.0 µm, in particular, from 0.1 to 2.0 µm.

Examples of the material of the conductive metal oxide grains as described above include ZnO, $TiO_2$, $SnO_2$, $Al_2O_3$, $In_2O_3$, MgO, Bao and $MoO_3$, a complex oxide thereof and a metal oxide comprising such a metal oxide together with a heterogeneous atom. As the metal oxide, $SnO_2$, ZnO, $Al_2O_3$, $TiO_2$, $In_2O_3$ and MgO are preferable, $SnO_2$, ZnO, $In_2O_3$ and $TiO_2$ are more preferable and $SnO_2$ is particularly preferable. As examples of the metal oxide containing a small amount of a heterogeneous atom, there can be enumerated Al- or In-doped ZnO, Nb- or Ta-doped $TiO_2$, Sn-doped $In_2O_3$ and Sb-, Nb- or halogen-doped $SnO_2$, each having from 0.01 to 30% by mol (preferably from 0.1 to 10% by mol) of the heterogeneous atom. When the heterogeneous atom is added in an amount of smaller than 0.01% by mol, a sufficient conductivity cannot be imparted to the complex metal oxide. When the amount thereof exceeds 30% by mol, the blackening degree of the grains is elevated and the antistatic layer (the layer containing the antistatic agent) becomes black, which is unsuitable as a silver salt photosensitizing material. Accordingly, it is preferable in the invention to use a metal oxide or a complex metal oxide containing a small amount of a heterogeneous atom as the material of the conductive metal oxide grains. Also, a metal oxide having oxygen defect in its crystal structure is preferable. As the conductive metal oxide grains containing a small amount of a heterogeneous atom, antimony-doped $SnO_2$ grains are preferable and $SnO_2$ grains doped with 0.2 to 2.0% by mol of antimony are particularly preferable. To form an antistatic layer having a high transparency and a favorable conductivity, it is advantageous in the invention to use grains of a metal oxide (for example, antimony-doped $SnO_2$) having such minor axis length and major axis length as described above. Thus, it is possible to easily obtain a silver salt photosensitive material which has a less static support having a haze of 3% or less and a surface resistivity of the surface layer of from $8\times10^6$ to $6\times10^8 \Omega$.

The reason for the advantageous formation of an antistatic layer having a high transparency and a favorable conductivity with the use of the needle-shaped metal oxide (for example, antimony-doped $SnO_2$) grains having the minor and major axis sizes as specified above is seemingly as follows. In the antistatic layer, these needle-shaped metal oxide grains are extended in the major axis direction in parallel to the surface of the antistatic layer while these grains merely occupy a space corresponding to the minor axis diameter in the thickness direction. Because of being extended along the major axis direction as described above, these needle-shaped metal oxide grains come into contact with each other at a higher frequency than commonly employed spherical grains. Thus, a high conductivity can be established even in a small amount. Accordingly, it is possible to lower the surface resistivity thereby without damaging the transparency. In the needle-shaped metal oxide grains as described above, the minor axis diameter is usually smaller than or almost the same as the thickness of the antistatic layer. Thus, these grains rarely project onto the surface. In the case of projecting, if any, the projections are very small and thus almost completely covered with the surface layer formed on the antistatic layer. As a result, there arises another advantage that little dusting (i.e., drop off of the projections from the layer) occurs in the course of transporting the support for the silver salt photosensitive material or in the course of transporting the sensitive material for exposure and development. In the case of spherical grains, the surface electrical resistivity of the silver salt photosensitive material relatively largely changes before and after the development process. In contrast thereto, an extremely change is observed in the case of using the needle-shaped metal oxide grains as described above. Thus, it can be said that the transporting properties after the development process are considerably improved. This is seemingly because, in the spherical grains, the alignment is more largely altered by the swelling or contraction of the film caused by the development process and thus the contact area among the grains becomes smaller than in the needle-shaped grains.

It is preferable that the antistatic agent to be used in the invention is coated in the form of a mixture with a binder for dispersing and holding the conductive metal oxide grains. As the material of the binder, use can be made of various polymers such as an acrylic resin, a vinyl resin, a polyurethane resin and a polyester resin. From the viewpoint of preventing dusting, it is preferable that the binder is a hardened product comprising a polymer (preferably an acrylic polymer, a vinyl polymer, a polyurethane polymer or a polyester polymer) and a carbodiimide compound. From the viewpoints of maintaining favorable working environment and preventing air pollution, it is preferable in the invention that both of the polymer and the carbodiimide compound are water-soluble or used in the state of being dispersed in water, e.g., as an emulsion. To enable crosslinkage with the carbodiimide compound, the polymer has any of a methylol group, a hydroxyl group, a carboxyl group and an amino group. Among all, a hydroxyl group and a carboxyl group are preferred and a carboxyl group is particularly preferred. The amount of the hydroxyl group or the carboxyl group contained in the polymer is preferably from 0.0001 to 1 eq./kg, particularly preferably form 0.001 to 1 eq./kg.

The amount of the inorganic oxide contained in the antistatic layer is preferably from 1 to 95% by mass, more preferably from 5 to 85% by mass and more preferably from 10 to 70% by mass.

(4) Peelable Protective Film

The light transmitting electromagnetic wave shielding film according to the present invention may be provided with a protective film.

Such protective films are not always provided on both faces of an electromagnetic wave shielding film (a light transmitting electromagnetic wave shielding film). That is, it is also possible that a protective film is provided exclusively on a mesh-like conductive metal part but not in the side of a transparent base film (i.e., corresponding to "the transparent support" as mentioned herein). It is also possible that a protective film is provided exclusively in the side of the transparent base film but not on the conductive metal part.

When employed in an optical filter, a liquid crystal display panel, a plasma display panel or the like as described above, the electromagnetic wave shielding film is bonded via the adhesive layer. Thus, the protective film as described above should be peeled off in the step of the lamination. It is therefore preferable that the protective film is laminated on the electromagnetic wave shielding film in a so-called peelable manner.

The peel strength of the protective film is preferably from 5 mN/25 mm width to 5 N/25 mm width, more preferably from 10 mN/25 mm width to 100 mN/25 mm width. A peel strength lower than the lower limit is undesirable, since peeling occurs too easily and, therefore, it is feared that the protective film might peel off during handling or due to an unintended contact in this case. Also, a peel strength exceeding the upper limit is undesirable, since a large force is needed for peeling and it is feared that the mesh-like conductive metal part might be separated from the transparent base film (or the adhesive layer) upon peeling in this case.

It is preferable that the protective film to be laminated in the transparent base film side is resistant to development and plating conditions. Namely, it is preferable that the protective film suffers from neither peeling nor strain after these processes.

To satisfy the requirements as discussed above, it is preferable to use, as the film constituting the protective film, a resin film made of a polyolefin resin such as a polyethylene resin or a polypropylene resin, a polyester resin such as a polyethylene terephthalate resin, a polycarbonate resin, an acrylic resin or the like. From the viewpoints as described above, it is also preferable that at least the face of the protective film serving as the outermost face when applied to the laminate has been subjected to corona discharge processing or an adhesion-facilitating layer has been formed thereon.

As a pressure-sensitive adhesive constituting the protective film, use can be made of an acrylate-based, rubber-based or silicone-based pressure-sensitive adhesive.

Such materials of the film for the protective film and for the pressure-sensitive adhesive are also applicable to the protective film to be applied in the conductive metal layer side. As these protective films, therefore, use can be made of either different films or the same one.

(5) Blackening Layer

The light transmitting electromagnetic wave shielding film according to the invention may be subjected to a blackening process.

The blackening process is disclosed by, for example, JP-A-2003-188576. A blackening layer formed by the blackening process can impart an antirust effect and antireflection properties. The blackening layer, which can be formed by, for example, a Co—Cu alloy plating, can inhibit the reflection on the surface of the metal foil. Further, a chromate processing may be conducted thereon as an antirust treatment. The chromate treatment is conducted by dipping the laminate in a solution containing a chromic acid salt or a bichromic acid salt as the main component and drying to thereby form an antirust coating film. If necessary, the chromate treatment can be conducted on one or both faces of the metal foil. The blackening layer may be formed by the plating method whereby a black coating film can be obtained. It can be formed by using, for example, a compound of nickel (Ni), zinc (Zn) or tin (Sn). Alternatively, it can be formed by using an electrodepositable ionic polymer material such as an electrodepositable coating material.

As an electrolyte bath (a black plating bath) containing the blackening materials as described above, it is possible in the invention to use a black plating bath containing nickel sulfate as the main component. Also, use can be made of a commercially available black plating bath. Specific examples usable herein include a black plating bath (NOBUROI SNC™, Sn—Ni alloy base) manufactured by Shimizu Co., Ltd., a black plating bath (NIKKA BLACK™, Sn—Ni alloy base) manufactured by NIHON KAGAKU SANGYO Co., Ltd.), a black plating bath (EBONY CHROM™ 85 SERIES, Cr-base) manufactured by KINZOKU KAGAKU KOGYO K.K. and so on.

In the case of thus forming the electrodeposited metal layer, use can be made of a metal electrolyte commonly employed in the art. Since there are many kinds of inexpensive metal electrolytes, this case is advantageous in that a metal electrolyte appropriate for the purpose can be freely selected.

In the case where the electrolytic plating metal is Cu, for example, the Cu surface can be blackened by surface-treating with a hydrogen sulfide ($H_2S$) solution.

In the invention, the blackening agent can be easily prepared by using a sulfide-based compound. Alternatively, there are many kinds of commercially available treating agents such as COPPER BLACK™CuO, COPPER BLACK™ CuS, selenium-based COPPER BLACK No. 65, etc. (manufactured by ISOLATE KAGAKU KENKYUSHO) and EBONOL C SPECIAL™ (manufactured by MELTEX Inc.) which can be also employed in the invention.

(6) Other Functional Layers

In the present invention, it is also possible to separately form functional layer(s) having function(s), if necessary. Such a functional layer may have various performances depending on the purpose. For example, an electromagnetic wave shielding material for a display may be provided with an antireflective layer having an antireflective function by controlling the refractive index and film thickness, a non-glare layer or an antiglare layer (both having a function of preventing dazzle), a color tone controlling layer capable of absorbing visible light in a definite wavelength region, an antifouling layer having a function of easily removing fouling with finger prints or the like, a hard coat layer preventing scuff marks, a layer capable of absorbing sock, a layer capable of preventing glass pieces from scattering upon breakage and so on. These functional layers may be formed either on the face opposite to the silver salt-containing layer across the support or in the same face side.

These functional layers may be bonded directly to a PDP. Alternatively, these layers may be bonded to a transparent substrate such as a glass plate or an acrylic resin plate separately from the main body of the plasma display panel. The thus constructed functional film is called an optical filter (or merely a filter).

(Antireflective and Antiglare Properties)

It is preferable that the light transmitting electromagnetic wave shielding film has either antireflective (AR) properties of preventing the reflection of outside light, antiglare (AG) properties of preventing mirror reflection or antireflective and antiglare (ARAG) properties satisfying both of these requirements imparted thereto.

Owing to the performances thereof, the problem of extraneous images, which are caused by the reflection of a lighting apparatus and etc. interfere the viewing of the display screen, can be overcome. By lowering the visible light reflectivity of the film surface, not only the prevention of the reflection of outside light but also an improvement in contrast and so on can be established. In the case of bonding an antireflective/antiglare functional film to the light transmitting electromagnetic wave shielding film, the visible light refractive index is preferably 2% or less, more preferably 1.3% or less and more preferably 0/8% or less.

The functional film as described above can be formed by providing an antireflective/antiglare functional layer on an appropriate transparent substrate.

An antireflective layer can be prepared by forming a single layer of a thin film made of a transparent fluoropolymer resin, magnesium fluoride, a silicone-based resin or silicon oxide at, for example, a ¼ wavelength optical film thickness, or laminating multiple layers of thin films having different refractive indexes and being made of an inorganic compound such as a metal oxide, a fluoride, a silicide, a nitride or a sulfide or an organic compound such as a silicone-based resin, an acrylic resin or a fluorinated resin.

An antiglare layer can be formed using an antiglare layer having small peaks and valleys of about 0.1 μm to about 10 μm on the surface. More specifically speaking, such a functional film is produced by dispersing grains of an inorganic compound or an organic compound such as silica, an organic silicon compound, melamine or acryl in a thermosetting or photosetting resin such as an acrylic resin, a silicone-based resin, a melamine-based resin, a urethane-based resin, an alkyd-based resin or a fluorinated resin to give an ink, and then coating the ink on the substrate followed by hardening.

The average diameter of the grains is preferably from about 1 to about 40 μm.

Alternatively, an antiglare layer can be formed by coating the thermosetting or photosetting resin and pressing a mold having a desired gloss or surface conditions against it followed by hardening.

After forming the antiglare layer, the haze of the light transmitting electromagnetic wave shielding film is 0.5% or more but not more than 20%, preferably 1% or more but not more than 10%. When the haze is too low, only insufficient antiglare properties can be obtained. At an extremely high haze, on the other hand, the sharpness of a transmission image is liable to be lowered.

(Hard Coat Properties)

To impart a sufficient scratch resistance to the light transmitting electromagnetic wave shielding film, it is favorable that the functional film has hard coat properties. A hard coat layer may be formed by using, for example, a thermosetting or photosetting resin such as an acrylic resin, a silicone-based resin, a melamine-based resin, a urethane-based resin, an alkyd-based resin or a fluorinated resin, though neither the material nor the formation method is particularly restricted. The thickness of the hard coat layer is preferably from about 1 to about 50 μm. It is favorable to form an antireflective layer and/or an antiglare layer on the hard coat layer, since a functional film having a scratch resistance, antireflective properties and/or antiglare properties can be thus obtained.

Concerning the surface hardness of the light transmitting electromagnetic wave shielding film having the hard coat properties imparted thereto, the pencil strength thereof determined in accordance with JIS (K-5400) is preferably at least H, more preferably 2H or above and more preferably 3H or above.

(Antistatic Properties)

To stick of prevent dusts and debris due to electrostatic charge or an electrical discharge upon contact with the human body, it is preferable that the light transmitting electromagnetic wave shielding film has antistatic properties.

As a functional film having antistatic properties, use can be made of a functional film having a high conductivity, for example, about $10^{11}\Omega/$ or less expressed in surface resistivity.

A film having a high conductivity can be obtained by forming an antistatic layer on a transparent substrate. Specific examples of the antistatic agent usable in the antistatic layer include PELLESTAT™ (manufactured by SANYO CHEMICAL INDUSTRIES, Ltd.), ELECTROSLIPPER™ (manufactured by KAO) and so on. It is also possible to form an antistatic layer by using a publicly known transparent conductive film typified by ITO or a conductive film having conductive micrograms such as ITO micrograms or tin oxide micrograms dispersed therein. It is also possible that antistatic properties are imparted to the hard coat layer, the antireflective layer or the antiglare layer by, for example, adding conductive micrograins.

(Antifouling Properties)

It is preferable that the light transmitting electromagnetic wave shielding film has antifouling properties, since fouling with finger prints or the like can be prevented and foulings, if any, can be easily removed thereby.

A functional film having antifouling properties can be obtained by, for example, providing an antifouling compound on a transparent substrate. As an antifouling compound, use can be made of a substance having no wetting characteristics to water and/or fat and oil, for example, a fluorine compound or a silicon compound. Specific examples of the fluorine-containing antifouling agent include OPTOOL™ (manufactured by DAIKIN INDUSTRIES, Ltd.) and so on, while specific examples of the silicon compound include TAKATAQUANTUM™ (manufactured by NOF Co.) and so on.

(Ultraviolet Ray Shielding Properties)

To prevent a dye and a transparent substrate as will be described hereinafter from deterioration, it is preferable that the light transmitting electromagnetic wave shielding film has ultraviolet ray shielding properties. Such a functional film having ultraviolet ray shielding properties can be obtained by adding a ultraviolet absorber to the transparent substrate per se or forming a ultraviolet ray absorption layer thereto.

To cut ultraviolet ray for protecting a dye, the transmittance in the ultraviolet region of wavelength shorter than 380 nm should be 20% or less, preferably 10% or less and more preferably 5% or less. A functional film capable of cutting ultraviolet ray can be obtained by forming a layer containing a ultraviolet ray absorber or an inorganic compound, which reflects or absorbs ultraviolet ray, on a transparent substrate. As the ultraviolet ray absorber, use can be made of a publicly known one such as benzotriazole or benzophenone. The kind and concentration thereof are determined based on the dispersibility or solubility in a medium in which it is to be dispersed or dissolved, the absorption wavelength, the absorption coefficient, the thickness of the medium and so on, without particular restriction.

It is preferable that the functional film capable of cutting ultraviolet ray has small absorption in the visible region and causes neither a large decrease in the visible light transmittance nor coloration such as yellowing.

In the case where a dye-containing layer as will be described hereinafter is formed in the functional film, it is preferable that a ultraviolet ray cutting layer is located outside of the layer.

(Gas Barrier Properties)

When the light transmitting electromagnetic wave shielding film is used in an environment at a temperature higher than room temperature or a humidity higher than ordinary humidity, it is sometimes observed that a dye as will be described hereinafter is deteriorated due to moisture or clouding arises due to moisture aggregation in an adhesive employed in bonding or the bonding interface. It is therefore preferable that the light transmitting electromagnetic wave shielding film has gas-barrier properties To prevent the dye denaturation or clouding, invasion of water into a dye-containing layer or the adhesive layer should be prevented. For this purpose, it is appropriate that the vapor transmission of the light transmitting electromagnetic wave shielding film is 10 g/m² day or less, preferably 5 g/m² day or less.

(Other Optical Characteristics)

In the case of using the light transmitting electromagnetic wave shielding film in a plasma display, it is preferable that the transmission color thereof is neutral gray or blue gray. This is because it is necessary to maintain or improve the light emission characteristics and contrast of the plasma display and a white color with a somewhat higher color temperature than the standard white color is preferred in some cases. It is said that a color plasma display has only insufficient color reproducibility. It is therefore preferable to selectively lower unnecessary light emission from a fluorescent body or discharged gas causing the above problem. In particular, a light emission spectrum in red display shows several emission peaks in a wavelength range of about 580 nm to about 700 nm and there arises a problem that red light emission becomes close to an orange color with a low color purity due to a relatively strong emission peak in the short wavelength side. These optical characteristics can be controlled by using a dye. Namely, near infrared rays can be cut by using a near infrared absorber while unnecessary light emission can be reduced by using a dye capable of selectively absorbing the unnecessary light emission, thereby achieving desired optical characteristics. It is also possible to achieve a favorable color tone of the optical filter by using a dye having an appropriate absorption within the visible region.

A dye may be contained by using one or more methods selected from: (1) using a polymer film or a resin plate produced by kneading one or more kinds of dyes with a transparent resin; (2) using a polymer film or a resin plate produced by the casting method by dispersing or dissolving one or more kinds of dyes in a thick resin solution comprising a resin monomer/an organic solvent; (3) using a polymer film or a resin plate coated with a coating produced by adding one or more kinds of dyes and a resin binder to an organic solvent; and (4) using a transparent pressure-sensitive adhesive containing one or more kinds of dyes; though the invention is not restricted thereto. The term "contained" as used herein means not only being contained in a base material, a layer such as a coating film or a pressure-sensitive adhesive but also being coated on the surface of a base or a layer.

The dye as described above may be a commonly employed dye or pigment having a desired absorption wavelength in the visible region and the kind thereof is not particularly restricted. Examples thereof include commonly marketed organic dyes such as anthraquinone, phthalocyanine, methine, azomethine, oxazine, imonium, azo, styryl, coumarine, porphyline, dibenzofuran, diketopyrropyrrole, rhodamine, xanthene, pyrromethene, dithiol and diimonium compounds. The kind and concentration of the dye are determined depending on the absorption wavelength and absorption coefficient of the dye, the transmission properties and transmittance required as an optical filter and the kind and thickness of a medium or a coating film in which it is to be dispersed, without particular restriction.

In a plasma display panel having a high surface temperature and being employed at a high environmental temperature, the optical filter temperature is also elevated. Therefore, it is preferable that the dye has such a heat resistance as not being seriously deteriorated by, for example, decomposition at 80° C. In addition to the heat resistance, some dyes are less resistant to light. When there arises the problem of deterioration caused by the light emission from a plasma display panel or ultraviolet light or visible light in the outside light, it is required to relieve the deterioration of a dye due to ultraviolet light by using a member containing a ultraviolet ray absorber or a ultraviolet ray blocking member or use a dye suffering from no serious deterioration caused by ultraviolet light or visible light. In addition to heat and light, the same applies to humidity and an environment having a combination of these factors. When a dye is deteriorated, the transmission characteristics of a display filter are changed and thus the color tone thereof is changed or the ability to cut near infrared rays is lowered. Since a dye is to be dispersed in a medium or a coating film, the solubility or dispersibility in an adequate solvent is also an important factor. In the invention, two kinds or more dyes having different absorption wavelengths may be contained in a single medium or coating film. It is also possible to provide two or more dye-containing media or coating films.

Some dyes would be deteriorated due to contact with a metal. In the case of using such a dye, it is more preferable that, in a functional film containing the dye, the dye-containing layer is located in such a manner as not being in contact with the metallic silver part or the conductive metal part in the light transmitting electromagnetic wave shielding film.

To prevent a decrease in the ability to shield electromagnetic wave of the light transmitting electromagnetic wave shielding film, it is desirable to earth the metallic silver part or the conductive metal part. Namely, it is desirable that a conduct part for earthing is formed on the light transmitting electromagnetic wave shielding film and the conduct part is brought into contact with the earthing part of the display body. The conduct part is appropriately formed along the periphery of the light transmitting electromagnetic wave shielding film around the metallic silver part or the conductive metal part.

The conduct part may be either a mesh pattern layer or a non-patterned layer such as a solid metal foil layer. To achieve favorable electrical conduct with the earthing part of the display body, however, a non-patterned conduct part such as a solid metal foil layer is preferred.

It is appropriate that the conduct part is non-patterned such as a solid metal foil and/or the conduct part has a sufficiently high mechanical strength, since the conduct part is usable as an electrode as such.

To protect the conduct part and/or to achieve favorable electrical conduct with the earthing part in the case where the conduct part is a mesh pattern layer, it is sometimes preferable to form an electrode in the conduct part. Although the electrode is not particularly restricted in shape, an electrode entirely covering the conduct part is preferred.

From the viewpoints of conductivity, corrosion resistance and adhesiveness to a transparent conductive film, examples of the material to be used for the electrode include pastes of metals such as silver, copper, nickel, aluminum, chromium, iron, zinc and carbon, which may be used either singly or as an alloy of two or more kinds thereof, mixtures of such metals (either singly or as an alloy) with a synthetic resin, and mixtures comprising borosilicate glass with such metals (either singly or as an alloy). To print and coat such a paste, use can be made of a publicly known method. Moreover, a marketed conductive tape is appropriately usable. As a conductive tape, use can be made of either a tape having conductivity in both faces or a single-side adhesive type using a conductive adhesive of the carbon dispersion type. A tape of the double-faced adhesive type is preferably employed. The thickness of the electrode is several μm to several mm, though the invention is not restricted thereto.

According to the present invention, it is possible to obtain an optical filter having excellent optical characteristics whereby the image qualities of a plasma display can be maintained or even improved without largely damaging the luminance thereof. It is also possible thereby to obtain an optical filter being excellent in the electromagnetic wave shielding ability to block electromagnetic wave generated from a plasma display, which has been pointed out as possibly exerting adverse effects on the health, being capable of efficiently cutting near infrared beams of about 800 to about 1000 nm generated from the plasma display without adversely affecting wavelengths employed by peripheral devices such as a remote control, transmitting optical communication systems and so on, and thus making it possible to prevent mechanical errors thereof. It is furthermore possible to provide an optical filter also having an excellent weatherability at a low cost.

When a film having the light transmitting electromagnetic wave shielding film according to the present invention is bonded to a functional film as described above, a PDP or a glass serving as a substrate of an optical filter, it is sometimes observed that bubbles invade. In this case, the bubbles invading between members upon bonding can be degassed or dissolved in the pressure-sensitive adhesive by pressurizing.

Examples of the method of the pressurization include a method comprising sandwiching the laminate between flat plates and pressing, a method comprising passing the laminate between nip rolls under elevated pressure and a method comprising putting the laminate into a pressurized container followed by pressurization, though the invention is not particularly restricted thereto. The method of pressurizing in a pressurized container is favorable, since pressure can be uniformly applied to the whole laminate without unevenness and multiple laminate sheets can be treated at the same time. As the pressurized container, use can be made of an autoclave.

Concerning the pressurization conditions, the invading bubbles can be removed at a higher efficiency and the treatment can be shortened under a higher pressure. Considering the restriction due to the pressure proofness of the laminate and the pressurization apparatus, the pressure is from about 0.2 MPa to about 2 MPa, preferably from 0.4 to 1.3 MPa. The pressurization time varies depending on the pressurization conditions without restriction. An excessively long pressurization time results in an increase in cost. It is therefore favorable to conduct the pressurization under appropriate conditions over a retention time of 6 hours or shorter. In the case of using a pressurized container, it is particularly appropriate to maintain the intended pressure level for about 10 minutes to about 3 hours.

It is preferable in some cases to conduct heating together with the pressurization. Heating causes a temporary increase in the flowability of the light transmitting pressure-sensitive adhesive and thus facilitates degassing or promotes the dissolution of the bubbles in the pressure-sensitive adhesive. Heating may be conducted at room temperature to not higher than about 80° C. depending on the heat tolerance of each member constituting the optical filter, though the invention is not particularly restricted thereby.

The pressurization or heating treatment is favorable, since it can improve the adhesion force after bonding the individual members constituting the optical filter.

EXAMPLES

Next, the characteristics of the present invention will be described in greater detail by referring to the following Examples and Comparative Examples. The materials, amounts, ratios, treatments, treating procedures and so on shown in the following Examples can be optionally altered within the scope of the present invention. That is to say, the scope of the invention should not be construed as being restricted to the following Examples.

Example 1

Production of Near Infrared Ray Shielding Film (Preparation of Composition for Shielding Near Infrared Ray)

2 parts by mass IRG-022 (manufactured by NIPPON KAYAKU, m.p.: 200° C.), which is N,N,N',N'-tetrakis(p-diethylaminophenyl)$_p$-benzoquinone-bis(imonium) hexafluoroantimonate, employed as a diimonium compound serving as the first near infrared ray absorbing dye, 1 part by mass of EX COLOR 810K (manufactured by NIPPON SHOKUBAI, the ratios of the maximum absorption wavelength to the maximum absorption coefficient at 450 nm, 550 nm and 620 nm being respectively 10.2, 8.3 and 9.1) employed as a phthalocyanine dye serving as the second near infrared ray absorbing dye, and 100 parts by mass of DIANAL BR-80 (manufactured by MITSUBISHI RAYON, glass transition temperature: 105° C.) were dissolved and mixed in a solvent mixture comprising methyl ethyl ketone with toluene (mixing ratio by mass: 50:50) to give a resin composition.

(Formation of Near Infrared Ray Shielding Layer)

On a PET resin film (manufactured by FUJI PHOTOFILM, thickness: 75 μm), the above-described resin composition for near infrared ray shielding layer containing the diimonium compound was coated to give a film thickness of 15 μm after drying. Thus, the near infrared ray shielding layer was laminated to give a near infrared ray shielding film.

[Production of Electromagnetic Wave Shielding Film]

(Silver Halide Photosensitive Material)

An emulsion containing 10.0 g of gelatin to 60 g of Ag in an aqueous medium and containing silver iodobromide grains (I=0.2% by mol, Br=40% by mol) having a sphere-corresponding average diameter of 0.1 μm was prepared.

In this emulsion, $K_3Rh_2Br_9$ and $K_2IrCl_6$ were added to give a concentration of $10^{-7}$ mol/mol of Ag thereby doping the silver bromide grains with Rh ions and Ir ions. To this emulsion, $Na_2PdCl_4$ was added and a gold-sulfur sensitization was conducted with the use of chloroauric acid and sodium thiosulfate. Next, the emulsion was coated together with a gelatin film hardening agent on the near infrared ray shielding film to give a silver coating amount of 1 g/m$^2$. In this step, the Ag/gelatin volume ratio was adjusted to ½. The emulsion was coated on the face opposite to the face coated with the near infrared ray shielding composition.

The emulsion was coated on a part (25 cm in width, 20 m in length) of a PET support having a width of 30 cm. Then the both edges (3 cm) of the support were cut off while remaining the center (24 cm) of the coated part to give a rolled silver halide photosensitive material.

(Exposure)

The silver halide photosensitive material was exposed using a continuous exposure apparatus described in the mode for carrying out the invention in JP-A-2004-1244 wherein exposure heads with the use of a DMD (digital mirror device) were aligned in a width of 25 cm, the exposure heads and an exposure stage were provided in a curved state for focusing images of laser beams onto the photosensitive layer, a photosensitive material-feeding unit and a winding unit were attached, and a deflection having a buffering action was given so as to prevent the effect of a change in the speeds of winding and feeding units on the speed of the exposure part. The exposure wavelength was 400 nm, the beam pattern was almost square in 11 μm, and the laser light source output was 100 μJ.

The exposure was conducted to give a 45° lattice pattern at intervals of 300 μm pitch having a width of 24 cm and a length of 10 m continuously. After the plating process as will be described hereinafter, it was confirmed that the copper pattern had a line width of 11 μm of 300 μm pitch.

(Development Processing)

Composition of Developing Solution (1 L)(Replenisher Having the Same Composition)

| hydroquinone | 27 g |
|---|---|
| sodium sulfite | 50 g |
| potassium carbonate | 40 g |
| ethylenediamine tetraacetate | 2 g |
| potassium bromide | 3 g |
| polyethylene glycol 2000 | 1 g |
| potassium hydroxide | 4 g |
| pH | adjusted to 10.3 |

Composition of Fixing Solution (1 L) (Replenisher Having the Same Composition)

| ammonium thiosulfate (75% solution) | 300 ml |
|---|---|
| ammonium sulfite monohydrate | 25 g |
| 1,3-diaminopropane tetraacetate | 8 g |
| acetic acid | 5 g |
| aqueous ammonia (27%) | 1 g |
| pH | adjusted to 6.2 |

Using the solutions as listed above, an exposed photosensitive material (also called a sensitized material) was subjected to a development processing by using an automatic development machine model FG-710 PTS (manufactured by FUJI FILM) under the following development conditions; development: 40 seconds at 25° C., fixation: 23 seconds at 304° C., water washing: 20 seconds under running water (5 L/min).

As a running processing, 100 m²/day of the photosensitive material was developed for 3 days while supplying 500 ml/m² of a developer replenisher and 640 ml/m² of the fixing solution.

Thus, a film having a lattice silver mesh pattern on a transparent film was constructed. The surface resistivity of this film was 50Ω/.

(Plating Process)

The film, on which the silver mesh pattern had been thus formed, was subjected to a plating process by using an electrolytic plating apparatus provided with an electrolytic plating tank (10) as illustrated in FIG. 1. The photosensitive material as described above was mounted to the electrolytic plating apparatus with the silver mesh face downward (bringing the silver mesh face into contact with feeding rollers).

As the feeding rollers (12a, 12b), specularized stainless rollers (diameter: 10 cm, length: 70 cm) having an electrolytic copper plating of 0.1 mm in thickness on the surface were employed. As a guide roller (14) and other transport rollers, not copper-plated rollers (diameter: 10 cm, length: 70 cm) were employed. By adjusting the height of the guide roller (14), a constant treating time in the plating solution was ensured regardless of the line speed.

The distance between the lowermost part of the contact face of the feeding roller (12a) in the inlet side and the silver mesh face of the film and the plating solution face (the distance La shown in FIG. 1) was adjusted to 10 cm. The distance between the lowermost part of the contact face of the feeding roller (12b) in the outlet side and the silver mesh part of the photosensitive material and the plating solution face (the distance Lb shown in FIG. 1) was adjusted to 20 cm.

In the plating process, the composition of the plating solution, the immersion time (in-solution time) in each bath and the application voltage to each bath are as follows. The treatment solution temperatures and the water-washing temperatures were all 25° C.

Composition of Electrolytic Plating Solution (Replenisher Having the Same Composition)

| copper sulfate pentahydrate | 75 g |
|---|---|
| sulfuric acid | 190 g |
| hydrochloric acid (35%) | 0.06 mL |
| Copper Gleam PCM (manufactured by Rohm and Haas Electronic Materials) | 5 mL |
| purified water | filling up to 1 L |
| Treating time in plating bath | |
| water washing | 1 min |
| acid washing | 30 sec. |
| plating 1 | 30 sec. |
| plating 2 | 30 sec. |
| plating 3 | 30 sec. |
| plating 4 | 30 sec. |
| water washing | 1 min |
| antirust treatment | 30 sec. |
| water washing | 1 min |

Film samples were treated in 10 m portions at a line speed of 2 m/min. Thus, an electromagnetic wave shielding film sample 1-1, which had an even surface resistivity and was uniformly plated, was obtained.

(Production of Comparative Sample and Evaluation)

For comparison, the silver mesh film having been developed as described above was cut into a piece (25 cm×25 cm). After attaching a copper electrode on one side, it was immersed in the above plating solution for 3 minutes and copper-plated under a voltage of 10 V. Thus, a comparative sample 1-2 was produced. The distance between the electrode and the plating solution was 10 cm.

The surface resistivity of the plated film was measured and the plating uniformity was evaluated with the naked eye. As a result, the sample was plated in the width of about 2 cm from the part closest to the solution face but the lower part was not plated even though having been immersed in the plating solution.

In accordance with the method described in Example 1 of Patent Document 10 (JP-A-2004-221564), an electromagnetic wave shielding film having an electromagnetic wave shielding film was produced as a sample 1-3. This sample was obtained by conducting batch type exposure using a photomask (5 cm×5 cm) and batch type electrolytic plating. Thus, the obtained mesh was 5 cm×5 cm in size.

By using this method, it was impossible to obtain an electromagnetic wave shielding film comprising such a mesh continuing 3 m or longer as in the present invention.

By the screen printing method, a paste containing metallic Pd micrograms was printed in a mesh pattern as in the sample 1-1 and electrolytic copper plating was conducted by using an electrolytic copper plating bath using copper sulfate and formalin to thereby give a comparative sample 1-4. Because of using the screen printing method, the mesh pattern had the same size as the screen mesh size. The thus obtained mesh capable of shielding electromagnetic wave was 20 cm×20 cm in size.

Use of this comparative sample restricted the size of the pattern of an electromagnetic wave shielding film produced by using the same. Thus, it was impossible to obtain an electromagnetic wave shielding film larger than the screen mesh size wherein a constant pattern continued.

Example 2

Production of Optical Filter

The continuous film of the sample 1-1 as described above was treated with a copper blackening solution to blacken the copper surface. As the blackening solution, a marketed product COPPER BLACK (manufactured by ISOLATE KAGAKU KENKYUSHO) was employed.

The surface resistivity of this electromagnetic wave shielding film was 0.3Ω/ .

The visible light transmittance of this electromagnetic wave shielding film was 90%.

The light transmitting electromagnetic wave shielding film thus obtained had an electromagnetic wave shielding ability and a near infrared ray shielding ability (transmittance of 800 to 1100 nm rays: 15% or lower) causing no problem in practice. Moreover, this film achieved both of these two abilities as a single film.

The transmittance was measured by using a spectrophotometer model U-3500 (manufactured by HITACHI).

The obtained film had a metal mesh consisting of thin lines of 12 μm in line width and was free from a part causing loss in producing an optical filter.

By using the film having the light transmittance and the electromagnetic wave shielding ability as described above, a glass plate was bonded to the inside (excluding the outer periphery of 20 mm) of the light transmitting electromagnetic wave shielding film via an acrylic light transmitting pressure-sensitive adhesive (thickness 25 μm). The acrylic light transmitting pressure-sensitive adhesive contained color correction dyes (PS-Red-G, PS-Violet-RC; manufactured by MITSUI CHEMICALS) controlling the transmittance characteristics of the optical filter. To the main opposite face of the glass plate, an antireflective film (REALOOK™; manufactured by NOF) was bonded via a pressure-sensitive adhesive to thereby give an optical filter.

The optical filter thus obtained had a black metal mesh, was free from color-metallization in the display image, showed an electromagnetic wave shielding ability and a near infrared ray cutting ability (transmittance of 800 to 1100 nm rays: 15% or lower) causing no problem in practice and was excellent in visibility owing to the antireflective layer. Further, a color correction function was imparted thereto the dyes added. Thus, it is appropriately usable as an optical filter in a plasma display and so on.

While the invention has been described with reference to particular embodiments, it will be clearly understood by a person skilled in the art that various changes and modifications may be made without departing from the spirit and scope of the invention.

The present application is based on a Japanese patent application filed on 15 Mar., 2005 (Japanese Patent Application 2005-073584) and the contents thereof are incorporated herein as reference.

The invention claimed is:

1. A light transmitting electromagnetic wave shielding film, which has a metallic silver part and a light transmitting part, which are formed by exposing an emulsion layer containing a silver salt emulsion formed on a support and then developing,
    which has a conductive metal part carrying a conductive metal in the metallic silver part which is formed by applying at least one of a physical development and/or a plating process to the metallic silver part,
    wherein the light transmitting electromagnetic wave shielding film has infrared ray shielding properties;
    the conductive metal part is made up of mesh-forming thin lines of from 1 μm to 40 μm in size and the mesh pattern continues for 3 m or longer; and
    the exposure energy for the exposure is 1 mJ/cm$^2$ or less.

2. The light transmitting electromagnetic wave shielding film according to claim 1, which comprises an infrared ray absorbing dye in the support.

3. The light transmitting electromagnetic wave shielding film according to claim 1, which comprises an infrared ray absorbing dye in a layer formed on the support.

4. The light transmitting electromagnetic wave shielding film according to claim 3, which comprises the infrared ray absorbing dye in a layer formed on the support in the opposite side to the metallic silver part.

5. The light transmitting electromagnetic wave shielding film according to claim 3, which comprises the infrared ray absorbing dye in a layer formed on the support in the same side as the metallic silver part.

6. The light transmitting electromagnetic wave shielding film according to claim 3,
    wherein the layer containing the infrared ray absorbing dye or a layer in contact with the layer containing the infrared ray absorbing dye contains an antistatic agent containing an inorganic oxide.

7. The light transmitting electromagnetic wave shielding film according to claim 1, which has an adhesive layer and comprises an infrared ray absorbing dye in the adhesive layer.

8. The light transmitting electromagnetic wave shielding film according to claim 1,
    wherein the exposure is conducted by scan-exposing the support provided with the emulsion layer containing a silver salt emulsion with a light beam while transporting the support.

9. The light transmitting electromagnetic wave shielding film according to claim 1,
    wherein a silver mesh obtained by developing the emulsion layer has a surface resistivity of from 1 to 1000Ω/□ and is electrolytically plated continuously at a transport speed of 1 to 30 m/min after the development treatment.

10. An optical filter, which comprises the light transmitting electromagnetic wave shielding film according to claim 1.

11. A plasma display panel, which comprises the light transmitting electromagnetic wave shielding film according to claim 1.

12. The light transmitting electromagnetic wave shielding film according to claim 1, wherein the support has a thickness of from 20 μm to 180 μm.

13. A method of manufacturing the light transmitting electromagnetic wave shielding film of claim 1 comprising, forming the metallic silver part and the light transmitting part by exposing the emulsion layer containing the silver salt emulsion formed on a support and then developing, and forming the conductive metal part carrying the conductive metal in the metallic silver part by applying at least one of the physical development and/or the plating process to the metallic silver part, wherein the exposure energy for the exposure is 1 mJ/cm$^2$ or less.

14. A light transmitting electromagnetic wave shielding film, which has a metallic silver part and a light transmitting part, which are formed by exposing an emulsion layer containing a silver salt emulsion formed on a support and then developing, which has a conductive metal part carrying a conductive metal in the metallic silver part which is formed by applying at least one of a physical development and/or a plating process to the metallic silver part, wherein the light transmitting electromagnetic wave shielding film has infrared ray shielding properties;

the conductive metal part is made up of mesh-forming thin lines of from 1 μm to 40 μm in size and the mesh pattern continues for 3 m or longer;

the exposure is conducted by a continuous exposure apparatus having an exposure head and an exposure stage provided in a curved state so as to focus an image of laser beam onto the emulsion layer;

a photosensitive material-feeding unit and a winding unit are attached to the continuous exposure apparatus;

and a deflection having a buffering action is provided to the continuous exposure apparatus so as to prevent an effect of a change in speeds of winding and photosensitive material-feeding units on a speed of an exposure part.

15. A method of manufacturing the light transmitting electromagnetic wave shielding film of claim 14 comprising, forming the metallic silver part and the light transmitting part by exposing the emulsion layer containing the silver salt emulsion formed on a support and then developing, and forming the conductive metal part carrying the conductive metal in the metallic silver part by applying at least one of the physical development and/or the plating process to the metallic silver part, wherein the exposure is conducted by the continuous exposure apparatus having the exposure head and the exposure stage provided in a curved state so as to focus the image of laser beam onto the emulsion layer;

the photosensitive material-feeding unit and the winding unit are attached to the continuous exposure apparatus;

and the deflection having the buffering action is provided to the continuous exposure apparatus so as to prevent the effect of the change in speeds of winding and photosensitive material-feeding units on the speed of the exposure part.

16. A light transmitting electromagnetic wave shielding film, which has a metallic silver part and a light transmitting part, which are formed by exposing an emulsion layer containing a silver salt emulsion formed on a support and then developing, which has a conductive metal part carrying a conductive metal in the metallic silver part which is formed by applying at least one of a physical development and/or a plating process to the metallic silver part, wherein the light transmitting electromagnetic wave shielding film has infrared ray shielding properties;

the conductive metal part is made up of mesh-forming thin lines of from 1 μm to 40 μm in size and the mesh pattern continues for 3 m or longer; and wherein the metallic silver part is formed by feeding the film into a plating bath containing a plating solution by using a feeding roller, wherein a distance between the lowermost part of a contact face of the feeding roller and the film and a face of the plating solution is adjusted to 0.5 to 15 cm.

17. A method of manufacturing the light transmitting electromagnetic wave shielding film of claim 16 comprising, forming the metallic silver part and the light transmitting part by exposing the emulsion layer containing the silver salt emulsion formed on a support and then developing, and forming the conductive metal part carrying the conductive metal in the metallic silver part by applying at least one of the physical development and/or the plating process to the metallic silver part, wherein the metallic silver part is formed by feeding the film into the plating bath containing the plating solution by using the feeding roller, wherein the distance between the lowermost part of the contact face of the feeding roller and the film and the face of the plating solution is adjusted to 0.5 to 15 cm.

* * * * *